(12) United States Patent
Park et al.

(10) Patent No.: US 11,935,924 B2
(45) Date of Patent: Mar. 19, 2024

(54) SEMICONDUCTOR DEVICE AND METHOD OF FABRICATING THE SAME

(71) Applicant: Samsung Electronics Co., Ltd., Suwon-si (KR)

(72) Inventors: Noh Yeong Park, Suwon-si (KR); Dong Il Bae, Seongnam-si (KR); Beomjin Park, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 203 days.

(21) Appl. No.: 17/371,582

(22) Filed: Jul. 9, 2021

(65) Prior Publication Data

US 2022/0173214 A1 Jun. 2, 2022

(30) Foreign Application Priority Data

Dec. 2, 2020 (KR) .................. 10-2020-0166512

(51) Int. Cl.
*H01L 29/10* (2006.01)
*H01L 21/8238* (2006.01)
*H01L 27/092* (2006.01)
*H01L 29/08* (2006.01)
*H01L 29/16* (2006.01)
*H01L 29/417* (2006.01)
*H01L 29/423* (2006.01)

(52) U.S. Cl.
CPC .. *H01L 29/1033* (2013.01); *H01L 21/823807* (2013.01); *H01L 21/823814* (2013.01); *H01L 21/823871* (2013.01); *H01L 27/092* (2013.01); *H01L 29/0847* (2013.01); *H01L 29/16* (2013.01); *H01L 29/41775* (2013.01); *H01L 29/42364* (2013.01); *H01L 29/42372* (2013.01)

(58) Field of Classification Search
CPC ......... H01L 29/1033; H01L 21/823807; H01L 21/823814; H01L 29/16; H01L 29/42372
See application file for complete search history.

(56) References Cited

U.S. PATENT DOCUMENTS 7,253,060 B2  8/2007  Yun et al.
8,236,595 B2  8/2012  Agarwal et al.
(Continued)

FOREIGN PATENT DOCUMENTS

KR        100555567 B1   3/2006
KR    10-2009-0075534 A  7/2009

*Primary Examiner* — Brian Turner
(74) *Attorney, Agent, or Firm* — Harness, Dickey & Pierce, P.L.C.

(57) ABSTRACT

Disclosed are semiconductor devices and/or method of fabricating the same. The semiconductor device comprises a substrate including first and second regions, a first active pattern on the first region and including a pair of first source/drain patterns and a first channel pattern including first semiconductor patterns, a second active pattern on the second region and including a pair of second source/drain patterns and a second channel pattern including second semiconductor patterns, a support pattern between two vertically adjacent first semiconductor patterns, and a first gate electrode and a second gate electrode on the first channel pattern and the second channel pattern. A channel length of the first channel pattern is greater than that of the second channel pattern. A ratio of a width of the support pattern to the channel length of the first channel pattern is in a range of 0.05 to 0.2.

19 Claims, 47 Drawing Sheets

(56) References Cited

U.S. PATENT DOCUMENTS

| | | |
|---|---|---|
| 8,999,851 B2 | 4/2015 | Leon et al. |
| 9,947,743 B2 | 4/2018 | Doris et al. |
| 10,593,804 B2 | 3/2020 | Kim et al. |
| 2006/0024874 A1 | 2/2006 | Yun et al. |
| 2017/0069715 A1* | 3/2017 | Balakrishnan ...... H01L 29/0657 |
| 2018/0090569 A1* | 3/2018 | Yang ................... H01L 27/0207 |
| 2021/0119005 A1* | 4/2021 | Colombeau ......... H01L 29/0653 |
| 2021/0210637 A1* | 7/2021 | Zhang ............... H01L 21/02532 |
| 2021/0336020 A1* | 10/2021 | Yu ....................... H01L 29/6656 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0166512 filed on Dec. 2, 2020 in the Korean Intellectual Property Office, the disclosure of which is hereby incorporated by reference in its entirety.

BACKGROUND

Inventive concepts relates to a semiconductor device and/or a method of fabricating the same, and more particularly, to a semiconductor device including a field effect transistor and/or a method of fabricating the same.

A semiconductor device includes an integrated circuit including metal oxide semiconductor field effect transistors (MOSFETs). As sizes and/or design rules of the semiconductor device are gradually decreased, sizes of the MOSFETs are also increasingly scaled down. The scale down of MOSFETs may deteriorate operating characteristics/electrical characteristics of the semiconductor device. Accordingly, various studies have been conducted to develop methods of fabricating semiconductor devices having improved/superior performances while overcoming or partially overcoming limitations caused by high integration of the semiconductor devices.

SUMMARY

Some example embodiments of inventive concepts provide a semiconductor device with improved electrical characteristics.

According to some example embodiments of inventive concepts, a semiconductor device may include a substrate including a first region and a second region, a first active pattern on the first region, the first active pattern including a pair of first source/drain patterns and a first channel pattern between ones of the pair of first source/drain patterns, the first channel pattern including a plurality of first semiconductor patterns stacked on the substrate, a second active pattern on the second region, the second active pattern including a pair of second source/drain patterns and a second channel pattern between ones the pair of second source/drain patterns, the second channel pattern including a plurality of second semiconductor patterns stacked on the substrate, a support pattern between two vertically adjacent ones of the plurality of first semiconductor patterns, the support pattern connecting the two vertically adjacent first semiconductor patterns to each other, and a first gate electrode and a second gate electrode on the first channel pattern and the second channel pattern, respectively. A length of the first channel pattern is greater than a length of the second channel pattern, and a ratio of a width of the support pattern to the length of the first channel pattern is in a range of about 0.05 to about 0.2.

According to some example embodiments of inventive concepts, a semiconductor device may include a substrate including a first region and a second region, a first active pattern on the first region, the first active pattern including a pair of first source/drain patterns and a first channel pattern between one of the pair of first source/drain patterns and the other of the pair of first source/drain patterns, the first channel pattern including a plurality of first semiconductor patterns stacked on the substrate, a second active pattern on the second region, the second active pattern including a pair of second source/drain patterns and a second channel pattern between one of the pair of second source/drain patterns and the other of the pair of second source/drain patterns, the second channel pattern including a plurality of second semiconductor patterns stacked on the substrate, a support pattern between two vertically adjacent ones of the plurality of first semiconductor patterns, the support pattern connecting the two vertically adjacent first semiconductor patterns to each other, and a first gate electrode and a second gate electrode on the first channel pattern and the second channel pattern, respectively. A length of the first channel pattern is greater than a length of the second channel pattern, and the support pattern contains an impurity of about 5 at % to about 10 at %.

According to some example embodiments of inventive concepts, a semiconductor device may include a substrate including a first region and a second region, a device isolation layer that defines a first active area on the first region and a second active area on the second region, a pair of first source/drain patterns and a pair of second source/drain patterns on the first active area and the second active area, respectively, a first channel pattern and a second channel pattern, the first channel pattern being between members of the pair of first source/drain patterns, the second channel pattern being between members of the pair of second source/drain patterns, and each of the first and second channel patterns including first, second, and third semiconductor patterns that are sequentially stacked on the substrate, first, second, and third support patterns on the first active area, the first support pattern between the substrate and the first semiconductor pattern, the second support pattern between the first semiconductor pattern and the second semiconductor pattern, and the third support pattern between the second semiconductor pattern and the third semiconductor pattern, a first gate electrode and a second gate electrode on the first channel pattern and the second channel pattern, respectively, a first gate dielectric layer and a second gate dielectric layer, the first gate dielectric layer between the first channel pattern and the first gate electrode, and the second gate dielectric layer between the second channel pattern and the second gate electrode, a pair of gate spacers on opposite sides of each of the first and second gate electrodes, a gate capping pattern on a top surface of each of the first and second gate electrodes, a plurality of active contacts electrically connected to the first and second source/drain patterns, a plurality of gate contacts electrically connected to the first and second gate electrodes, a first metal layer on the active contacts and the gate contacts, the first metal layer including a plurality of first lines electrically connected to the active contacts and the gate contacts, and a second metal layer on the first metal layer. A length of the first channel pattern is greater than a length of the second channel pattern, and at least one selected from the first, second, and third support patterns has a crooked sidewall.

According to some example embodiments of inventive concepts, a method of fabricating a semiconductor device may include alternately stacking a plurality of semiconductor layers and a plurality of sacrificial layers on a substrate that includes a first region and a second region, patterning the semiconductor layers and the sacrificial layer to form a first active pattern on the first region and to form a second active pattern on the second region, forming on the substrate a mask layer having an opening that exposes one area of the first active pattern, performing an ion implantation process on the one area of the first active region to form a plurality of support patterns from the sacrificial layers, forming a pair of first source/drain patterns and a pair of second source/drain patterns on the first active pattern and the second active pattern, respectively, replacing the sacrificial layers between the pair of first source/drain patterns with a first gate electrode, and replacing the sacrificial layers between the pair of second source/drain patterns with a second gate electrode. While the sacrificial layers are replaced with the first gate electrode, the support patterns remain and support the semiconductor layers that are stacked.

DETAILED DESCRIPTION OF SOME EXAMPLE EMBODIMENTS

Figure 1:
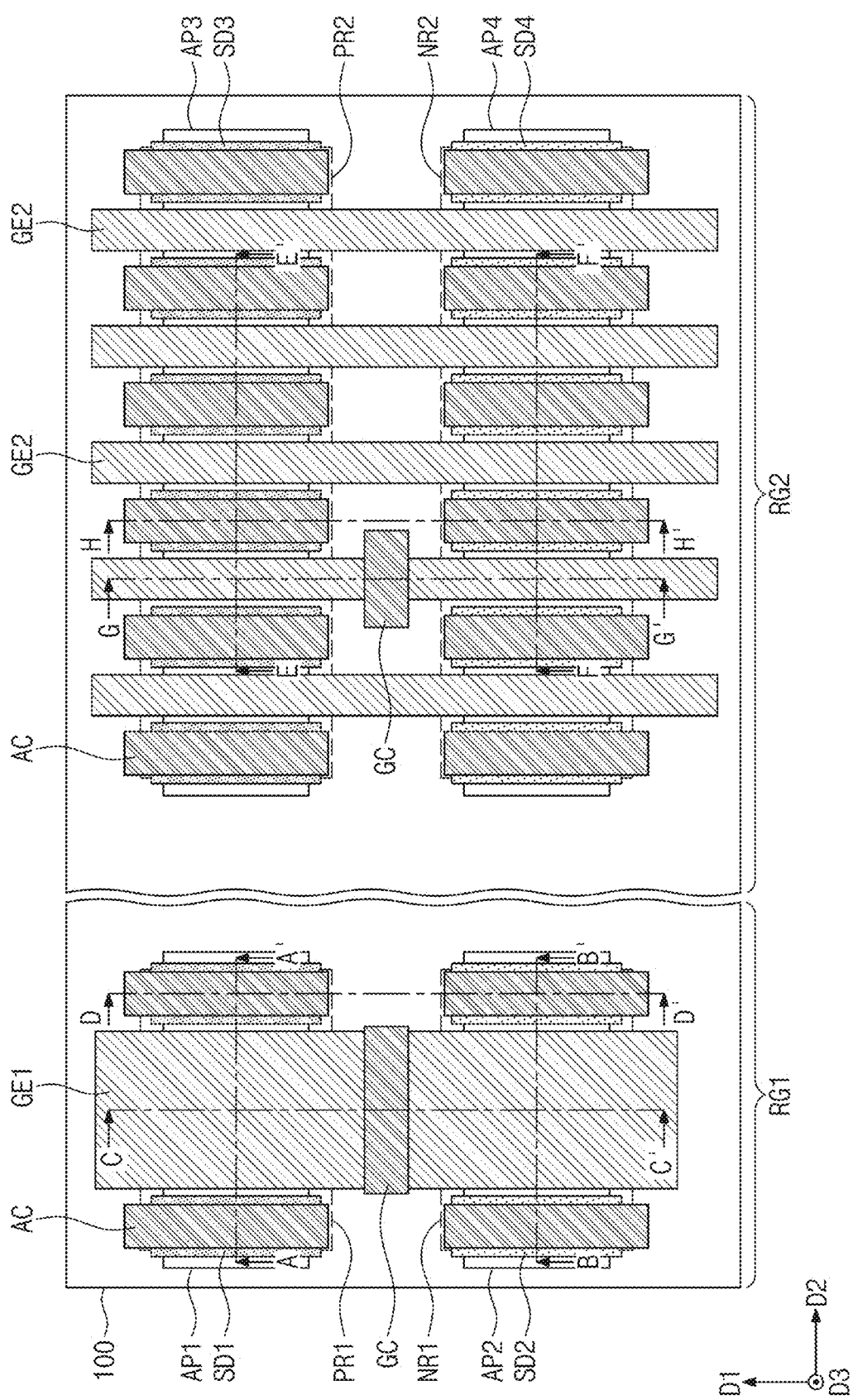
FIG. 1 illustrates a plan view showing a semiconductor device according to some example embodiments of inventive concepts.

FIG. 1 illustrates a plan view showing a semiconductor device according to some example embodiments of inventive concepts. FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.

Referring to FIG. 1, a substrate 100 may be provided which includes a first region RG1 and a second region RG2. The substrate 100 may be or may include a doped or undoped single-crystal semiconductor substrate, and may be or may include a compound semiconductor substrate or a semiconductor substrate including silicon, germanium, or silicon-germanium. For example, the substrate 100 may be a silicon substrate, e.g. a lightly doped single-crystal silicon substrate. Each of the first and second regions RG1 and RG2 may be or correspond to a cell region on which is disposed a standard cell included in a logic circuit. Alternatively, the first region RG1 may be a peripheral area on which are disposed transistors that constitute/are included in a process core and/or an I/O terminal. The first region RG1 may include a long gate transistor (or, long channel/long channel length transistor) whose gate length (e.g., whose channel length) is relatively large. A transistor on the first region RG1 may operate at higher powers/higher voltages such as higher threshold voltages than those of a transistor on the second region RG2. A transistor on the first region RG1 will be first discussed below in detail with reference to FIGS. 1 and 2A to 2D.

The first region RG1 may include a first PMOSFET region PR1 and a first NMOSFET region NR1. The first PMOSFET region PR1 and the first NMOSFET region NR1 may be defined by/separated by a second trench TR2 formed on an upper portion of the substrate 100. For example, the second trench TR2 may be positioned between the first PMOSFET region PR1 and the first NMOSFET region NR1. The first PMOSFET region PR1 and the first NMOSFET region NR1 may be spaced apart from each other in a first direction D1 across the second trench TR2.

A first trench TR1 formed on the upper portion of the substrate 100 may define a first active pattern AP1 and a second active pattern AP2. The first active pattern AP1 and the second active pattern AP2 may be provided respectively on the first PMOSFET region PR1 and the first NMOSFET region NR1. The first trench TR1 may be shallower than the second trench TR2. The first and second active patterns AP1 and AP2 may extend in a second direction D2. The first and second active patterns AP1 and AP2 may be vertically protruding portions of the substrate 100. The first trench TR1 and/or the second trench TR2 may have a tapered profile; however, example embodiments are not limited thereto. Furthermore there may be other trenches (not shown) that are deeper into the substrate 100 than that of the second trench TR2; however, example embodiments are not limited thereto.

A device isolation layer ST may fill the first and second trenches TR1 and TR2. The device isolation layer ST may include a silicon oxide layer, and may be or correspond to a shallow trench isolation (STI) layer. The first and second active patterns AP1 and AP2 may have their upper portions that protrude vertically upwards from the device isolation layer ST (see FIG. 2C). The device isolation layer ST may cover none of the upper portions of the first and second active patterns AP1 and AP2. The device isolation layer ST may cover lower sidewalls of the first and second active patterns AP1 and AP2.

The first active pattern AP1 may include a first channel pattern CH1 on the upper portion thereof. The second active pattern AP2 may include a second channel pattern CH2 on the upper portion thereof. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3. Although the figures illustrate three semiconductor patterns SP1, SP2, and SP3, example embodiments are not limited thereto. For example there may be more than three, or less than three, semiconductor patterns.

Each of or any of the first, second, and third semiconductor patterns SP1, SP2, and SP3 may include at least one of silicon (Si), germanium (Ge), or silicon-germanium (SiGe). For example, each of the first, second, and third semiconductor patterns SP1, SP2, and SP3 may include crystalline (e.g. single crystalline) silicon. In a case where the first, second, and third semiconductor patterns SP1, SP2, and SP3 include SiGe), a stoichiometric ration between silicon and germanium may or may not be 1:1.

A pair of first source/drain patterns SD1 may be provided on the upper portion of the first active pattern AP1. The first source/drain patterns SD1 may be impurity regions having a first conductivity type (e.g., p-type, such as boron). The first, second, and third semiconductor patterns SP1, SP2, and SP3 of the first channel pattern CH1 may be interposed between the pair of first source/drain patterns SD1. For example, the first, second, and third semiconductor patterns SP1, SP2, and SP3 of the first channel pattern CH1 may connect the pair of first source/drain patterns SD1 to each other. For example, one of the pair of first source/drain patterns SD1 may be or correspond to a source of a transistor, and the other of the pair of first source/drain patterns SD1 may be or correspond to a drain of the transistor.

A pair of second source/drain patterns SD2 may be provided on the upper portion of the second active pattern AP2. The second source/drain patterns SD2 may be impurity regions having a second conductivity type (e.g., n-type such as arsenic and/or phosphorus). The first, second, and third semiconductor patterns SP1, SP2, and SP3 of the second channel pattern CH2 may be interposed between the pair of second source/drain patterns SD2. For example, the first, second, and third semiconductor patterns SP1, SP2, and SP3 of the second channel pattern CH2 may connect the pair of second source/drain patterns SD2 to each other. For example, one of the pair of second source/drain patterns SD2 may be or correspond to a source of a transistor, and the other of the pair of second source/drain patterns SD2 may be or correspond to a drain of the transistor.

The first and second source/drain patterns SD1 and SD2 may be epitaxial patterns formed by a selective epitaxial growth process such as a heterogeneous or homogenous epitaxial growth process. For example, each of the first and second source/drain patterns SD1 and SD2 may have a top surface located at a level substantially the same as that of a top surface of the third semiconductor pattern SP3. For another example, at least one selected from the first and second source/drain patterns SD1 and SD2 may have a top surface higher than that of the third semiconductor pattern SP3 adjacent thereto.

The first source/drain patterns SD1 may include a semiconductor element (e.g., SiGe in a stoichiometric ratio of 1:1 or not in a stoichiometric ratio of 1:1) whose lattice constant is greater than that of a semiconductor element of the substrate 100. Therefore, the first source/drain patterns SD1 may provide the first channel pattern CH1 with compressive stress.

Alternatively or additionally, the second source/drain patterns SD2 may include the same semiconductor element (e.g., Si) as that of the substrate 100. For another example, the second source/drain patterns SD2 may include not only silicon (Si) but also carbon (C). For example, the second source/drain patterns SD2 may include silicon carbide (SiC). When the second source/drain pattern SD2 includes silicon carbide (SiC), the second source/drain pattern SD2 may have a carbon concentration of about 10 at % to about 30 at %, e.g. may not have a stoichiometric ratio of 1:1. A pair of second source/drain patterns SD2 including silicon carbide (SiC) may provide the second channel pattern CH2 therebetween with tensile stress.

A support pattern SUP may be provided on the first PMOSFET region PR1. The support pattern SUP may be provided between neighboring semiconductor patterns of the first channel pattern CH1. For example, a plurality of support patterns SUP may be correspondingly interposed between the substrate 100 and the first semiconductor pattern SP1, between the first semiconductor pattern SP1 and the second semiconductor pattern SP2, and between the second semiconductor pattern SP2 and the third semiconductor pattern SP3. The support patterns SUP may physically connect the substrate 100 to the stacked first, second, and third semiconductor patterns SP1, SP2, and SP3. The support patterns SUP may provide mechanical support to the first, second, and third semiconductor patterns SP1, SP2, and SP3.

Additionally or alternatively, a support pattern SUP may be provided on the first NMOSFET region NR1. On the first NMOSFET region NR1, a plurality of support patterns SUP may be provided to physically connect the substrate 100 to the stacked first, second, and third semiconductor patterns SP1, SP2, and SP3.

A first gate electrode GE1 may be provided to extend in the first direction D1, while running across the first and second active patterns AP1 and AP2. The first gate electrode GE1 may extend from the first PMOSFET region PR1 toward the first NMOSFET region NR1. The first gate electrode GE1 may vertically overlap the first and second channel patterns CH1 and CH2.

The first gate electrode GE1 may include a first part P01 interposed between the substrate 100 and the first semiconductor pattern SP1, a second part P02 interposed between the first semiconductor pattern SP1 and the second semiconductor pattern SP2, a third part P03 interposed between the second semiconductor pattern SP2 and the third semiconductor pattern SP3, and a fourth part P04 on the third semiconductor pattern SP3. The first gate electrode GE1 may include other parts; for example, in a case where there are more than three semiconductor patterns the first gate electrode GE1 may include additional parts between respective semiconductor patterns.

For example, referring back to FIG. 2A, the support pattern SUP may divide the first part P01 into two pieces. The support pattern SUP may divide the second part P02 into two pieces. The support pattern SUP may divide the third part P03 into two pieces.

Referring back to FIGS. 1 and 2A to 2D, a pair of gate spacers GS may be disposed on opposite sidewalls of the first gate electrode GE1. The gate spacers GS may extend in the first direction D1 along the first gate electrode GE1. The gate spacers GS may have their top surfaces higher than that of the first gate electrode GE1. The top surfaces of the gate spacers GS may have be coplanar with that of a first interlayer dielectric layer 110 which will be discussed below. The gate spacers GS may include at least one selected from SiCN, SiCON, and SiN. Alternatively or additionally, the gate spacers GS may each include a multi-layer formed of at least two selected from SiCN, SiCON, and SiN.

A gate capping pattern GP may be provided on the first gate electrode GE1. The gate capping pattern GP may extend in the first direction D1 along the first gate electrode GE1. The gate capping pattern GP may include a material having an etch selectivity with respect to first and second interlayer dielectric layers 110 and 120, which will be discussed below.

For example, the gate capping pattern GP may include at least one selected from SiON, SiCN, SiCON, and SiN.

A first gate dielectric layer GI1 may be interposed between the first gate electrode GE1 and the first channel pattern CH1 and between the first gate electrode GE1 and the second channel pattern CH2. The first gate dielectric layer GI1 may extend along a bottom surface of the first gate electrode GE1 that overlies the first gate dielectric layer GI1. The first gate dielectric layer GI1 may cover a top surface of the device isolation layer ST that underlies the first gate electrode GE1.

In some example embodiments of inventive concepts, the first gate dielectric layer GI1 may include one or more of a silicon oxide layer, a silicon oxynitride layer, and a high-k dielectric layer. The high-k dielectric layer may include a material whose dielectric constant is greater than that of a silicon oxide layer, e.g. is greater than 3.6. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternatively or additionally, a semiconductor device according to some example embodiments of inventive concepts may include a negative capacitance field effect transistor. that uses a negative capacitor. For example, the first gate dielectric layer GI1 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a subthreshold swing of less than about 60 mV/decade at room temperature (or about 20 degrees Celsius).

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with/incorporates zirconium (Zr). For another example, the hafnium zirconium oxide may be a compound of hafnium (Hf), zirconium (Zr), and oxygen (O).

The ferroelectric material layer may further include impurities doped into the ferroelectric material. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include aluminum of about 3 at % to about 8 at %. In this description, the ratio of impurities may be a ratio of aluminum to the sum of hafnium and aluminum. When the impurities are silicon (Si), the ferroelectric material layer may include silicon of about 2 at % to about 10 at %. When the impurities are yttrium (Y), the ferroelectric material layer may include yttrium of about 2 at % to about 10 at %. When the impurities are gadolinium (Gd), the ferroelectric material layer may include gadolinium of about 1 at % to 7 at %. When the impurities are zirconium (Zr), the ferroelectric material layer may include zirconium of about 50 at % to about 80 at %.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but inventive concepts are not limited thereto.

The ferroelectric and paraelectric material layers may include, e.g. may be made of, the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but inventive concepts are not limited thereto. Because ferroelectric materials have their own critical thickness that exhibits ferroelectric properties, the thickness of the ferroelectric material layer may depend on ferroelectric material.

For example, the first gate dielectric layer GI1 may include a single ferroelectric material layer. For another example, the first gate dielectric layer GI1 may include a plurality of ferroelectric material layer that are spaced apart from each other. The first gate dielectric layer GI1 may have a stack-layered structure in which a plurality of ferroelectric material layers are stacked alternately with a plurality of paraelectric material layers.

The first gate electrode GE1 may include a first metal pattern and a second metal pattern on the first metal pattern. The first gate dielectric layer GI1 may be provided thereon with the first metal pattern adjacent to the first and second channel patterns CH1 and CH2. The first metal pattern may include a work-function metal that controls, e.g. increases or decreases, a threshold voltage of a transistor. A thickness and composition of the first metal pattern may be adjusted to achieve a desired threshold voltage of a transistor.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo).

In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta).

Although not shown, the second metal pattern may not be included in the first, second, and third parts P01, P02, and P03 of the first gate electrode GE1, and may be included in only the fourth part P04 of the first gate electrode GE1. For example, the first, second, and third parts P01, P02, and P03 of the first gate electrode GE1 may include only the first metal pattern, and the fourth part P04 of the first gate electrode GE1 may include all of the first and second metal patterns.

Figure 2B:
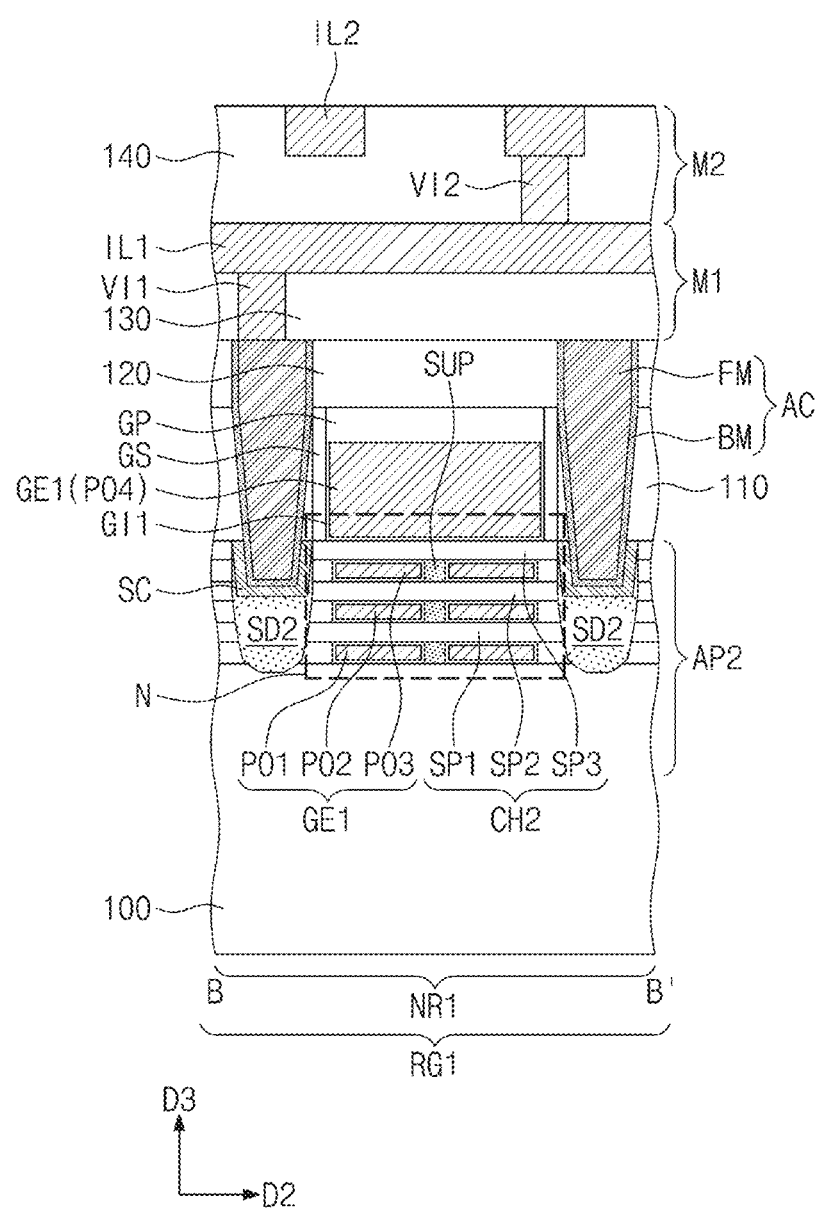
Figure 3A:
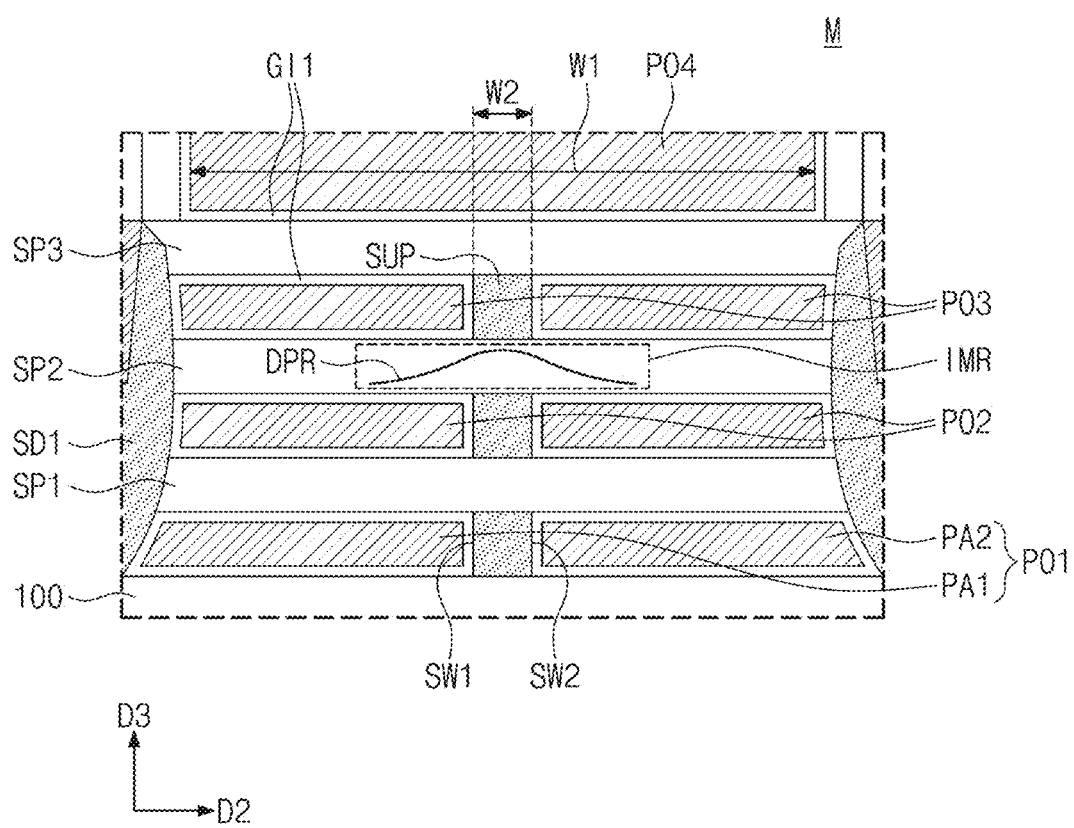
FIG. 3A illustrates an enlarged cross-sectional view showing section M of FIG. 2A.
Figure 3B:
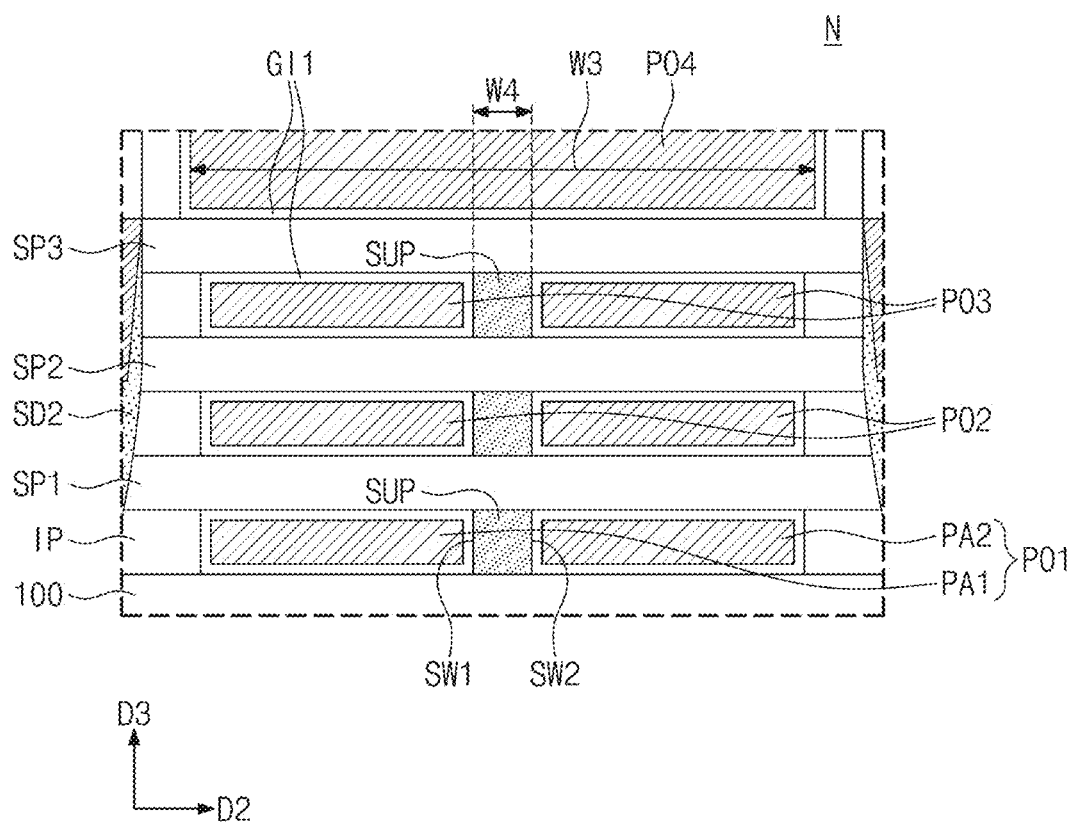
FIG. 3B illustrates an enlarged cross-sectional view showing section N of FIG. 2B.

Referring back now to FIG. 2B and for example FIG. 3B, inner spacers IP may be provided on the first NMOSFET region NR1. The inner spacers IP may be correspondingly interposed between the second source/drain pattern SD2 and the first, second, and third parts P01, P02, and P03 of the first gate electrode GE1. The inner spacers IP may be in direct contact with the second source/drain pattern SD2. The inner spacer IP may cause each of the first, second, and third parts P01, P02, and P03 of the first gate electrode GE1 to separate from the second source/drain pattern SD2.

The inner spacer IP may include a low-k dielectric material. The low-k dielectric material may include either silicon oxide or a material whose dielectric constant is less than that of silicon oxide. For example, the low-k dielectric material may include at least one selected from silicon oxide, silicon oxide doped with fluorine or carbon, porous silicon oxide, and organic polymeric dielectrics.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and those of the gate spacers GS. The first interlayer dielectric layer 110 may be provided thereon with a second interlayer dielectric layer 120 that covers the gate capping pattern GP. For example, the first and second interlayer dielectric layers 110 and 120 may include a silicon oxide layer. The first and second interlayer dielectric layers 110 and 120 may or may not have an interface therebetween.

Active contacts AC may be provided to penetrate the first and second interlayer dielectric layers 110 and 120 and to correspondingly have electrical connection with the first and second source/drain patterns SD1 and SD2. A pair of active contacts AC may be provided on opposite sides of the first gate electrode GE1. When viewed in plan, the active contact AC may have a bar shape that extends in the first direction D1.

The active contact AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

The active contact AC may be or correspond to a self-aligned contact (SAC). For example, the gate capping pattern GP and the gate spacer GS may be used to form the active contact AC in a self-aligned manner. For example, the active contact AC may cover at least a portion of a sidewall of the gate spacer GS. Although not shown, the active contact AC may partially cover a portion of the top surface of the gate capping pattern GP.

A silicide pattern SC (e.g. a salicide pattern) may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP and to have electrical connection with the first gate electrode GE1. The gate contact GC may be provided on the device isolation layer ST between the first PMOSFET region PR1 and the first NMOSFET region NR1. When viewed in plan, the gate contact GC may have a square shape or a bar shape or an oval shape that extends in the second direction D2. Likewise the active contact AC, the gate contact GC may include a conductive pattern FM and a barrier pattern BM that surrounds the conductive pattern FM.

A third interlayer dielectric layer 130 may be provided on the second interlayer dielectric layer 120. A first metal layer M1 may be provided in the third interlayer dielectric layer 130. The first metal layer M1 may include first lines IL1 and first vias VI1. The first vias VI1 may be provided below the first lines ILL The first lines IL1 may be disposed along the first direction D1. Each of the first lines IL1 may have a linear or bar shape that extends in the second direction D2.

The first vias VI1 may be correspondingly provided below the first lines IL1 of the first metal layer M1. The first vias VI1 may be correspondingly interposed between the active contacts AC and the first lines ILL The first vias VI1 may be correspondingly interposed between the gate contacts GC and the first lines IL1.

The first line IL1 and the underlying first via VI1 of the first metal layer M1 may be formed by separate processes from each other. For example, each of the first line IL1 and the first via VI1 may be formed by a single damascene process; however, example embodiments are not limited thereto. A sub-20 nm process may be employed to fabricate a semiconductor device according to some example embodiments.

A fourth interlayer dielectric layer 140 may be provided on the third interlayer dielectric layer 130. A second metal layer M2 may be provided in the fourth interlayer dielectric layer 140. The second metal layer M2 may include second lines IL2. Each of the second lines IL2 may have a linear or bar shape that extends in the first direction D1. For example, the second lines IL2 may parallel extend in the second direction D2.

The second metal layer M2 may further include second vias VI2. The second vias VI2 may be correspondingly provided below the second lines IL2. The second vias VI2 may be correspondingly interposed between the first line IL1 and the second lines IL2.

The second line IL2 and the underlying second via VI2 may be formed as a single piece in the same process; however, example embodiments are not limited thereto. For example, a dual damascene process may be employed to simultaneously form the second line IL2 and the second via VI2 of the second metal layer M2.

The first lines IL1 of the first metal layer M1 may include a conductive material the same as or different from that of the second lines IL2 of the second metal layer M2. For example, the first and second lines IL1 and IL2 may include at least one metal selected from copper (Cu), ruthenium (Rh), cobalt (Co), tungsten (W), aluminum (Al), and molybdenum (Mo).

In some example embodiments of inventive concepts, although not shown, metal layers (e.g., M3, M4, M5, etc.) may be additionally stacked on the fourth interlayer dielectric layer 140. Each of the stacked metal layers may include routing lines. The routing lines of alternating metal layers may extend substantially in perpendicular directions; however, example embodiments are not limited thereto.

A transistor on the second region RG2 will be discussed below in detail with reference to FIGS. 1 and 2E to 2H. Omission will be made to avoid repetitive technical features to those of the transistor on the first region RG1 discussed with reference to FIGS. 1 and 2A to 2D, and a difference thereof will be described in detail.

The second region RG2 may include a second PMOSFET region PR2 and a second NMOSFET region NR2. The second PMOSFET region PR2 and the second NMOSFET region NR2 may be defined by a fourth trench TR4 formed on the upper portion of the substrate 100. A third active pattern AP3 and a fourth active pattern AP4 may be defined by a third trench TR3 formed on the upper portion of the substrate 100. The third active pattern AP3 and the fourth active pattern AP4 may be provided respectively on the second PMOSFET region PR2 and the second NMOSFET region NR2.

The third active pattern AP3 may include a third channel pattern CH3 on an upper portion thereof, and the fourth active pattern AP4 may include a fourth channel pattern CH4 on an upper portion thereof. Each of the third and fourth channel patterns CH3 and CH4 may include first, second, and third semiconductor patterns SP1, SP2, and SP3 that are sequentially stacked. Although the figures illustrate three semiconductor patterns SP1, SP2, and SP3, example embodiments are not limited thereto. For example, there may be more than three, or less than three, semiconductor patterns. The number of semiconductor patterns SP1, SP2, and SP3 included in the third and fourth active patterns AP3 and AP4 may be the same as the number of semiconductor patterns SP1, SP2, and SP3 included in the first and second active patterns AP1 and AP2.

The first, second, and third semiconductor patterns SP1, SP2, and SP3 of the third and fourth channel patterns CH3 and CH4 may be shorter than/shorter in the second direction D2 than the first, second, and third semiconductor patterns SP1, SP2, and SP3 of the first and second channel patterns CH1 and CH2 discussed above. For example, each of the first, second, and third semiconductor patterns SP1, SP2, and SP3 of the third and fourth channel patterns CH3 and CH4 may have a length in the second direction D2, e.g. a gate length or a channel length, less than a length in the second direction D2 of each of the first, second, and third semiconductor patterns SP1, SP2, and SP3 of the first and second channel patterns CH1 and CH2. The second region RG2 may include a short gate transistor (or short channel transistor) whose gate length (or channel length) is relatively small. There may be a lower threshold voltage for transistors included in the second region RG2 than transistors included in the first region RG1.

Third source/drain patterns SD3 may be provided on the upper portion of the third active pattern AP3. Fourth source/drain patterns SD4 may be provided on the upper portion of the fourth active pattern AP4. The first, second, and third semiconductor patterns SP1, SP2, and SP3 of the third channel pattern CH3 may be interposed between a pair of third source/drain patterns SD3. The first, second, and third semiconductor patterns SP1, SP2, and SP3 of the fourth channel pattern CH4 may be interposed between a pair of fourth source/drain patterns SD4.

Each of the third source/drain patterns SD3 may be or may include an epitaxial pattern that contains impurities having a first conductivity type (e.g., p-type), such as boron. Each of the fourth source/drain patterns SD4 may be or may include an epitaxial pattern that contains impurities having a second conductivity type (e.g., n-type, such as phosphorus and/or arsenic).

Second gate electrodes GE2 may be provided to extend in the first direction D1, while running across the third and fourth channel patterns CH3 and CH4. The second gate electrode GE2 may extend from the second PMOSFET region PR2 toward the second NMOSFET region NR2. The second gate electrode GE2 may vertically overlap the third and fourth channel patterns CH3 and CH4. A pair of gate spacers GS may be disposed on opposite sidewalls of the second gate electrode GE2. A gate capping pattern GP may be provided on the second gate electrode GE2.

Similar to the first gate electrode GE1, the second gate electrode GE2 may include first, second, third, and fourth parts P01, P02, P03, and P04. Different from the first region RG1 discussed above, the second region RG2 may not include the support pattern SUP. Therefore, each of the first, second, and third parts P01, P02, and P03 on the second region RG2 may not be divided by the support pattern SUP into two pieces.

Referring back to FIG. 2G, the second gate electrode GE2 may be provided on a top surface TOS, a bottom surface BOS, and opposite sidewalls SIW of each of the first, second, and third semiconductor patterns SP1, SP2, and SP3. For example, a transistor according to some example embodiments may be a three-dimensional field effect transistor, e.g., a multi-bridge channel field effect transistor (MBCFET™) and/or a gate-all-around field effect transistor (GAAFET) in which a gate electrode surrounds a channel three-dimensionally.

Referring back to FIGS. 1 and 2E to 2H, a second gate dielectric layer GI2 may be interposed between the second gate electrode GE2 and the third channel pattern CH3 and between the second gate electrode GE2 and the fourth channel pattern CH4. The second gate dielectric layer GI2 may directly cover the top surface TOS, the bottom surface BOS, and the opposite sidewalls SIW of each of the first, second, and third semiconductor patterns SP1, SP2, and SP3. The second gate dielectric layer GI2 may include one or more of a silicon oxide layer, a silicon nitride layer, and a high-k dielectric layer. For example, the second gate dielectric layer GI2 on the second region RG2 may have a thickness less than that of the first gate dielectric layer GI1 on the first region RG1.

The second NMOSFET region NR2 may be provided thereon with inner spacers IP (see, e.g. FIG. 3B). The inner spacers IP may be correspondingly interposed between the fourth source/drain pattern SD4 and first, second, and third parts P01, P02, and P03 of the second gate electrode GE2.

In contrast, the inner spacers IP may be omitted from the second PMOSFET region PR2.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the third and fourth source/drain patterns SD3 and SD4. A gate contact GC may be provided to penetrate the second interlayer dielectric layer 120 and the gate capping pattern GP and to have electrical connection with the second gate electrode GE2. A first metal layer M1 and a second metal layer M2 may be provided on the second interlayer dielectric layer 120. The detailed descriptions of the active contacts AC, the gate contact GC, the first metal layer M1, and the second metal layer M2 may be substantially the same as those discussed with reference to FIGS. 1 and 2A to 2D.

The following will describe in detail the first channel pattern CH1, the first gate electrode GE1, and the support pattern SUP that are provided on the first region RG1 discussed above. FIG. 3A illustrates an enlarged cross-sectional view showing section M of FIG. 2A.

Figure 2A:
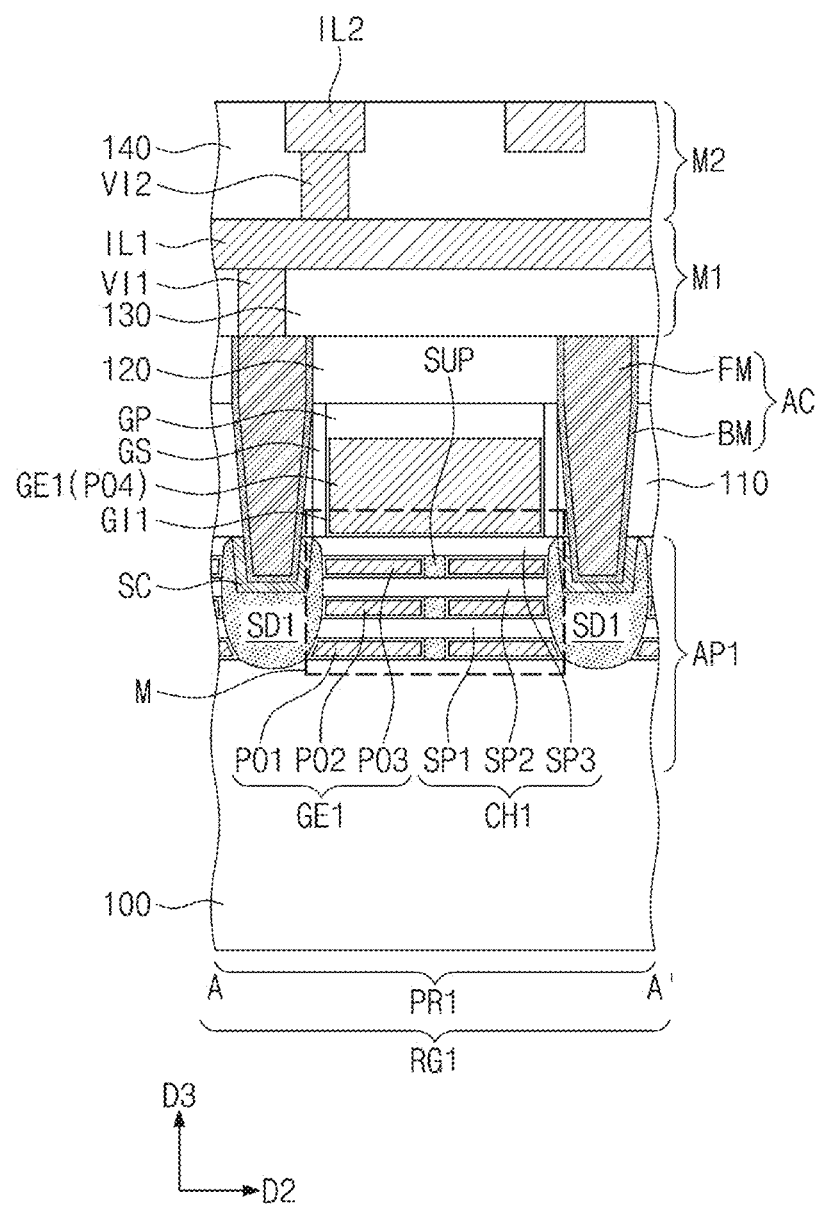
FIGS. 2A, 2B, 2C, 2D, 2E, 2F, 2G, and 2H illustrate cross-sectional views respectively taken along lines A-A', B-B', C-C', D-D', E-E', F-F', G-G', and H-H' of FIG. 1.
Figure 2C:
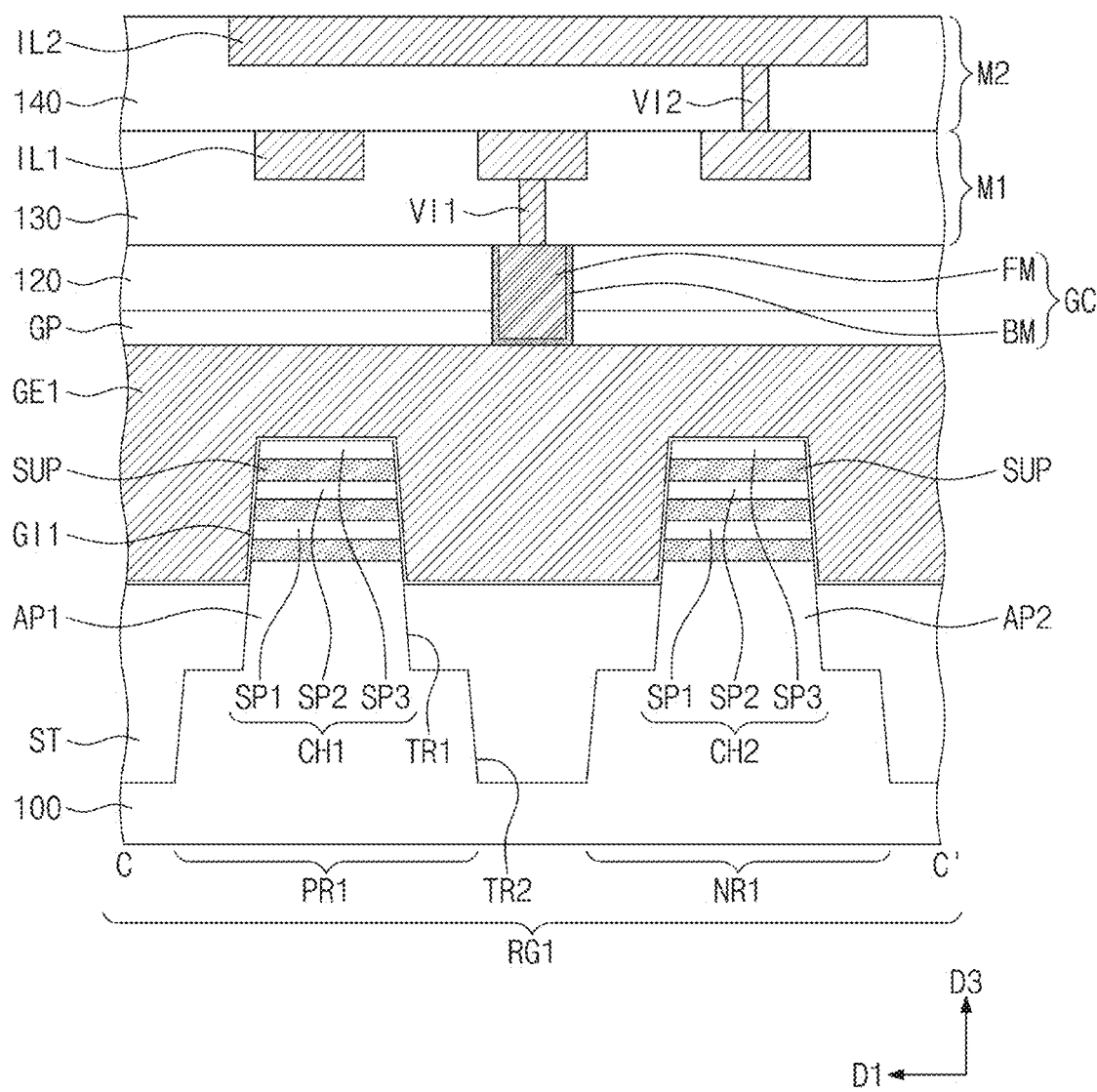
Figure 2D:
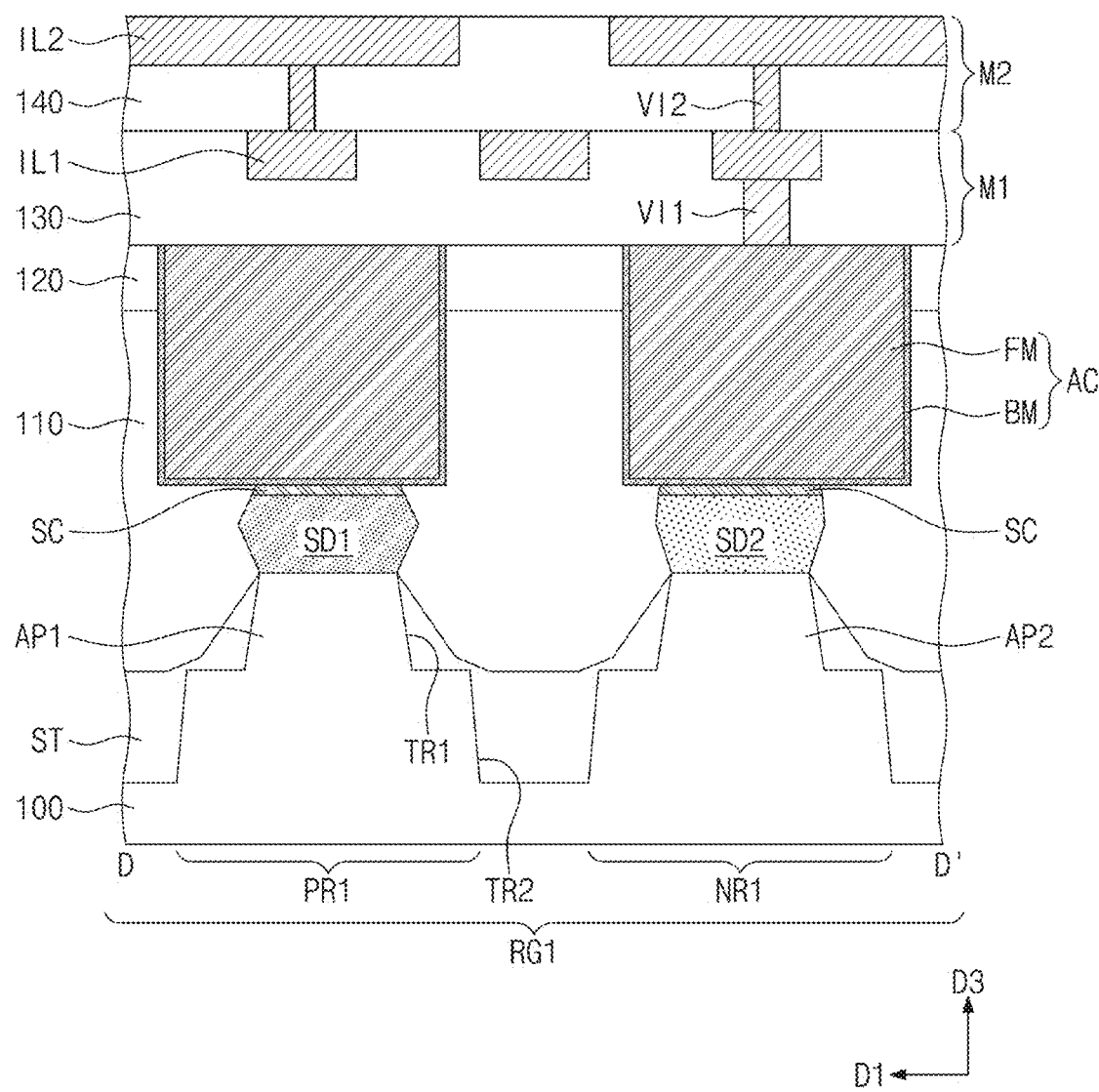
Figure 2E:
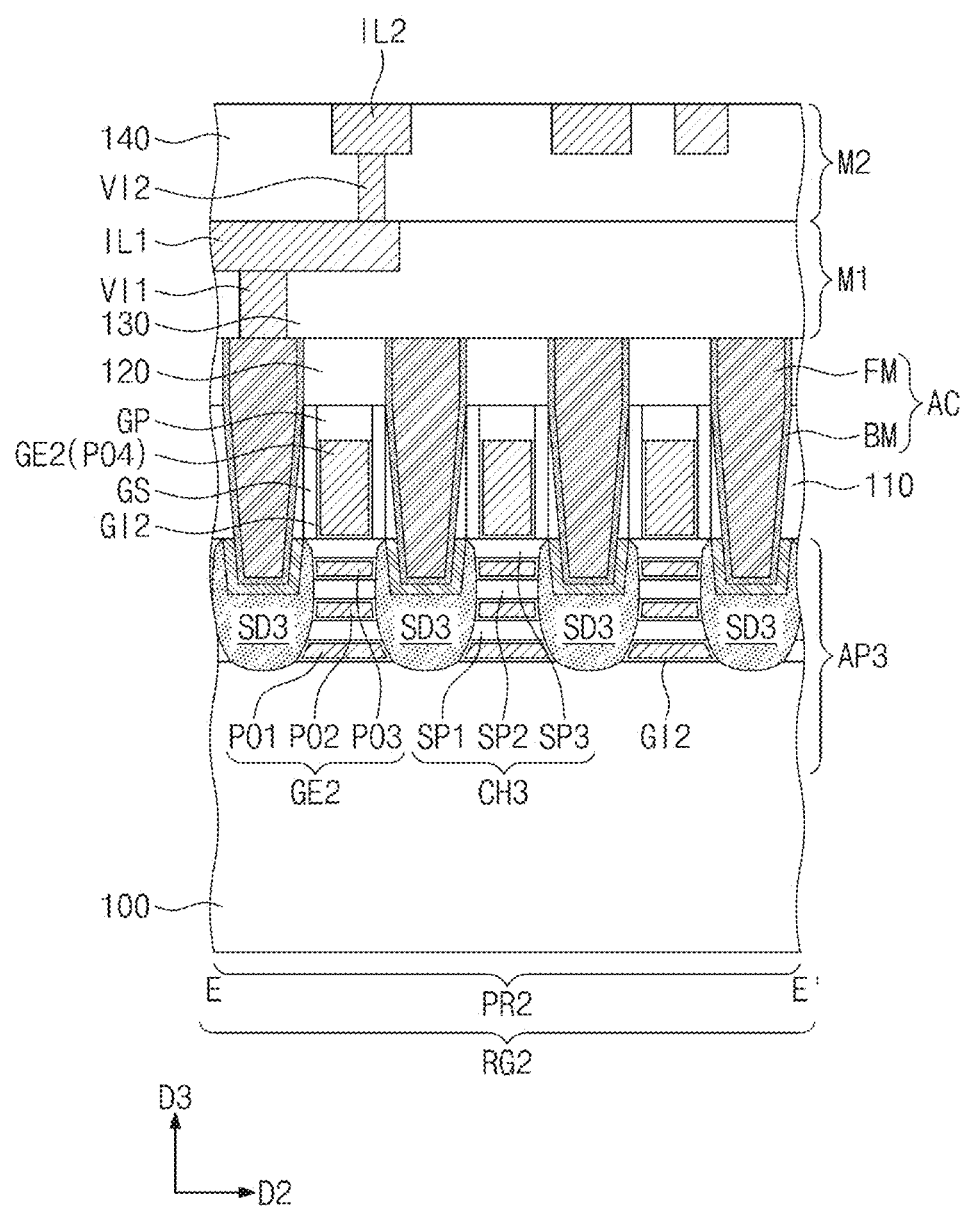
Figure 2F:
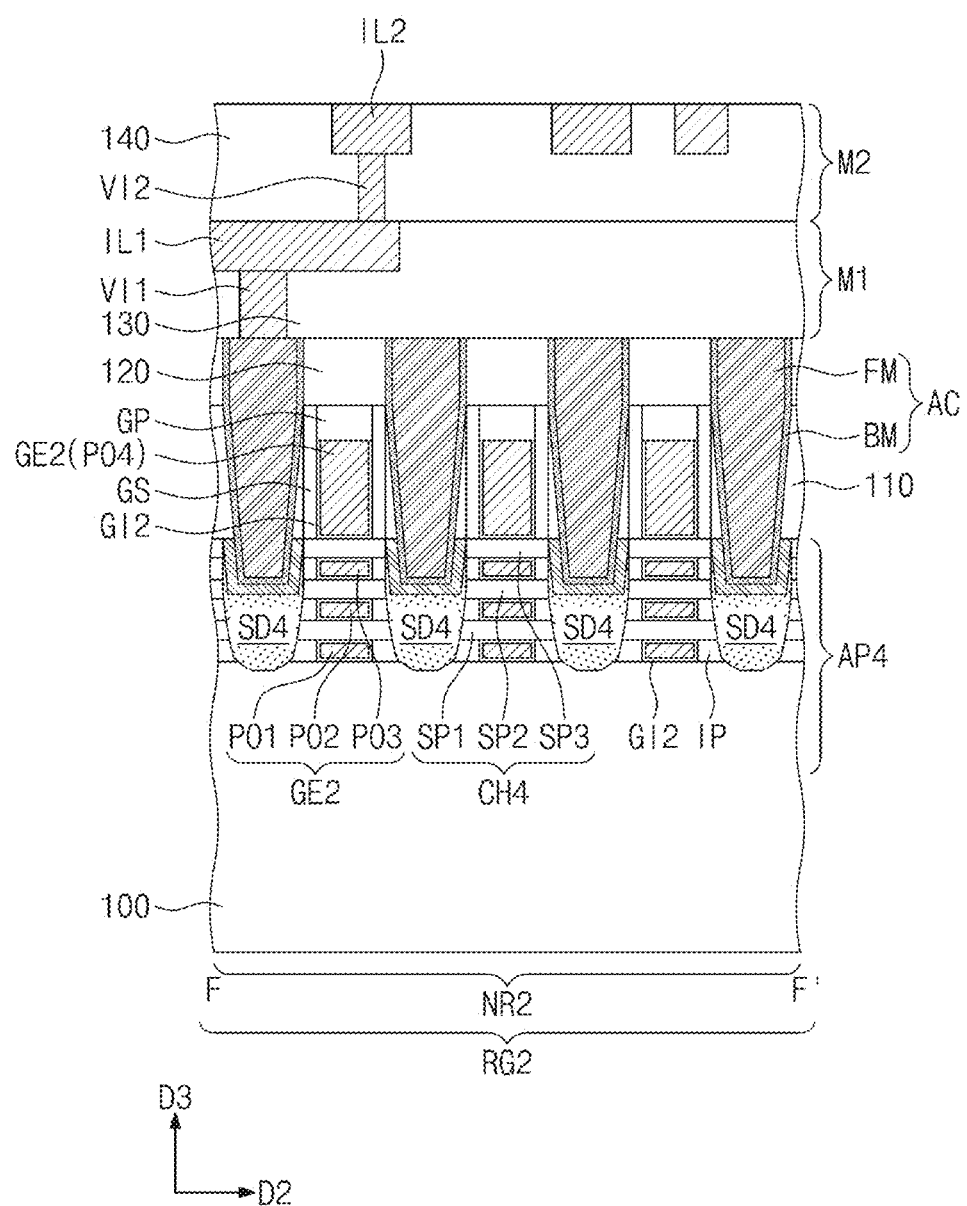
Figure 2G:
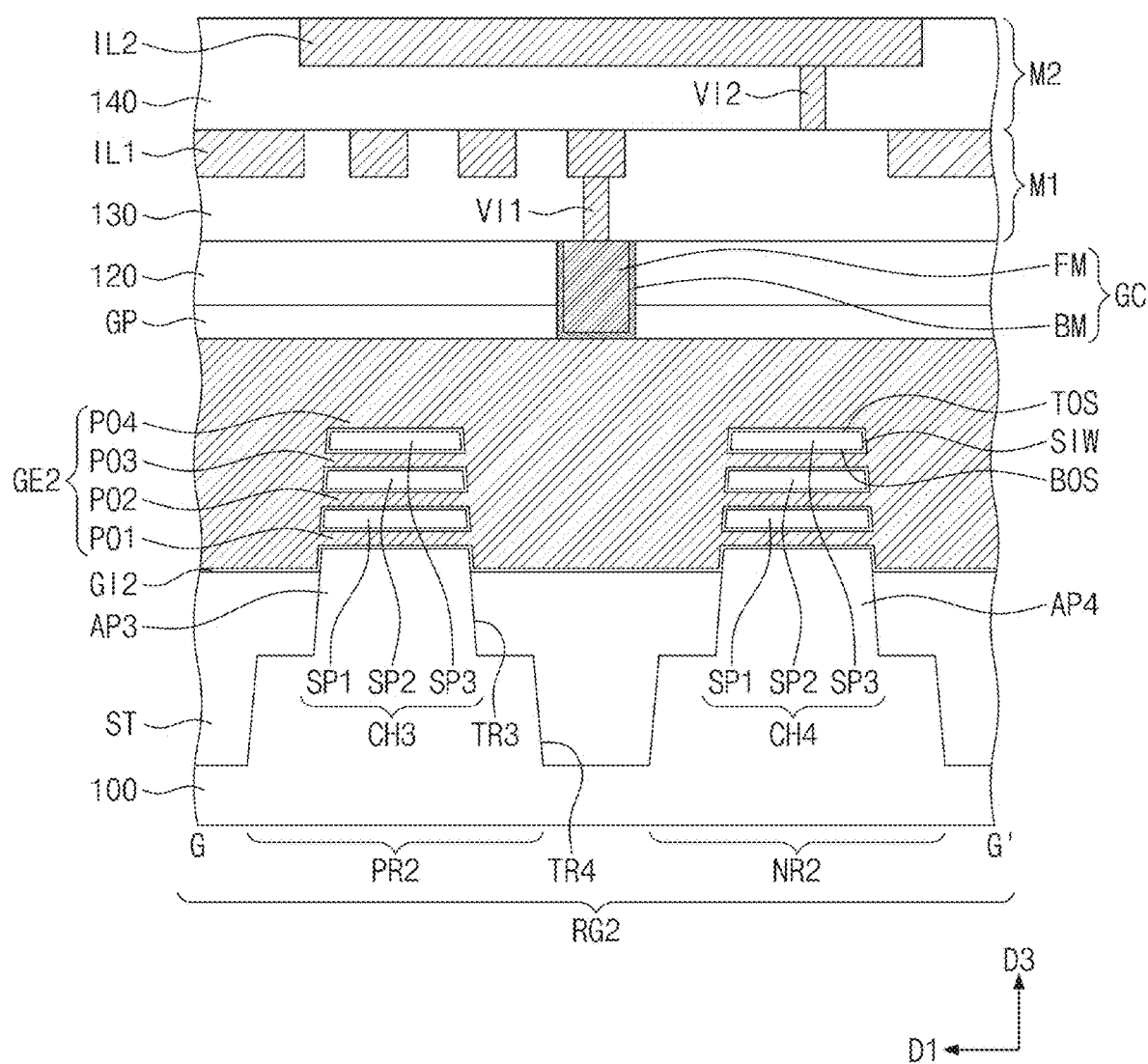
Figure 2H:
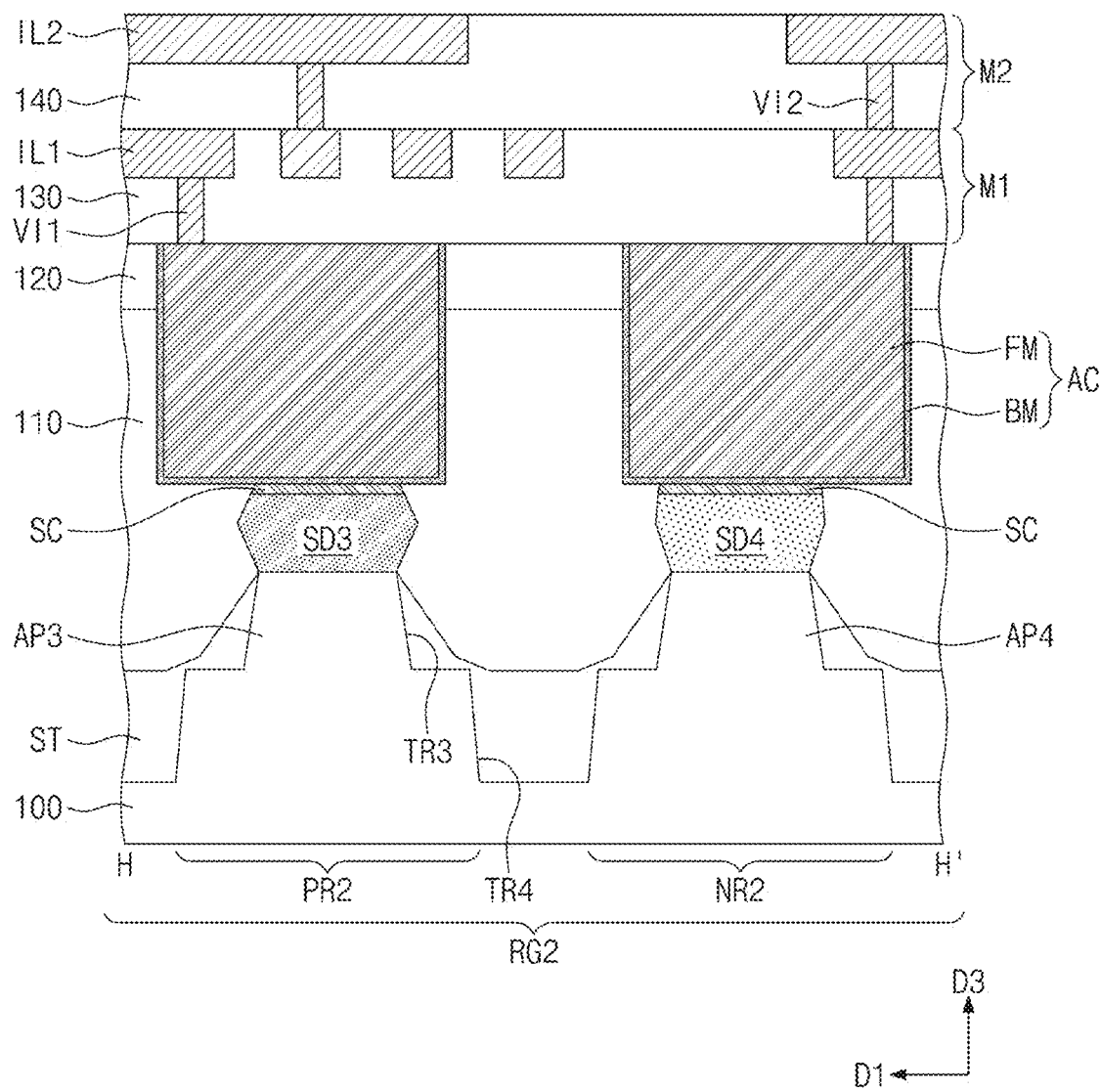

Referring to FIGS. 2A, 2C, and 3A, the support pattern SUP may be interposed between the substrate 100 and the first semiconductor pattern SP1. The support pattern SUP may be positioned below a central area of the first semiconductor pattern SP1. The support pattern SUP may have a first sidewall SW1 and a second sidewall SW2 that are opposite to each other in the second direction D2. The first part P01 of the first gate electrode GE1 may include a first segment PA1 adjacent to the first sidewall SW1 of the support pattern SUP, and may also include a second segment PA2 adjacent to the second sidewall SW2 of the support pattern SUP. The first segment PA1 and the second segment PA2 may have the same width as each other or different widths from each other. The first gate dielectric layer GI1 may be interposed between the first segment PA1 and the support pattern SUP and between the second segment PA2 and the support pattern SUP. The first gate dielectric layer GI1 may cover, e.g. directly cover the first and second sidewalls SW1 and SW2 of the support pattern SUP.

The support pattern SUP may be or include silicon-germanium (SiGe). The support pattern SUP may further include an impurity, such helium (He). For example, the support pattern SUP may have a germanium (Ge) concentration of about 10 at % to about 35 at % and an impurity concentration (of, for example, helium) of about 5 at % to about 10 at %. There may or may not be other impurities included in the support pattern SUP. For example, there may or may not be impurities such as either or any of group III or group V impurities such as boron, phosphorus, or arsenic included in the support pattern SUP; however, example embodiments are not limited thereto.

Each of the first, second, and third semiconductor patterns SP1, SP2, and SP3 may include an impurity region IMR adjacent to the support pattern SUP. For example, the second semiconductor pattern SP2 may have its impurity region IMR positioned on a central area thereof. The impurity region IMR may contain or include the same impurity as that of the support pattern SUP. FIG. 3A depicts by way of example a concentration profile DPR of impurities contained in the impurity region IMR. The concentration profile DPR of impurities in the impurity region IMR may increase to a large (e.g. a local or global maximum) value and then decrease again, in a direction from one side toward other side of the impurity region IMR. The concentration profile DPR may reach the maximum value at its center, or a location that vertically overlaps the support pattern SUP. The impurity region IMR may have a maximum impurity concentration of about 5 at % to about 10 at %.

A first width W1 may be given as a maximum width in the second direction D2 at the fourth part P04 of the first gate electrode GE1. The first width W1 may be defined to refer to a channel length, a gate length, or a length of a channel pattern. For example, the first width W1 may range from about 70 nm to about 300 nm. The first width W1 may correspond to a length in which majority carriers such as electrons or holes traverse from one of the first source/drain patterns SP1 to the other of the first source/drain patterns SP2.

An uppermost support pattern SUP, or the support pattern SUP between the second and third semiconductor patterns SP2 and SP3, may have a second width W2 in the second direction D2. The second width W2 may be less than the first width W1. For example, a ratio (W2/W1) of the second width W2 to the first width W1 may range from about 0.05 to about 0.2 (i.e., from about 5% to about 20%). The first width W1 may range from about 3.5 nm to about 60 nm. The width W1 may be referred to as a length of the first channel pattern CH1, and the width W2 may be referred to as a width of the support pattern SUP.

When the ratio (W2/W1) is greater than about 0.2, the support pattern SUP may have a relatively larger size, and thus each of the first, second, and third parts P01, P02, and P03 of the first gate electrode GE1 may have a relatively smaller volume. Therefore, a transistor may decrease in driving force and/or electrical characteristics. Alternatively, when the ratio (W2/W1) is less than about 0.05, the support pattern SUP may not physically support the first, second, and third semiconductor patterns SP1, SP2, and SP3. Thus, at least one selected from the first, second, and third semiconductor patterns SP1, SP2, and SP3 may become bent.

The following will describe in detail the second channel pattern CH2, the second gate electrode GE2, and the support pattern SUP that are provided on the first region RG1 discussed above. FIG. 3B illustrates an enlarged cross-sectional view showing section N of FIG. 2B.

Referring to FIGS. 2B, 2C, and 3B, the support patterns SUP may be correspondingly interposed between the first, second, and third semiconductor patterns SP1, SP2, and SP3. For example, the support pattern SUP may divide the first part P01 of the first gate electrode GE1 into the first segment PA1 and the second segment PA2.

A third width W3 may be given as a large, e.g. a maximum width in the second direction D2 at the fourth part P04 of the first gate electrode GE1. The third width W3 may be substantially the same as the first width W1 discussed above. The uppermost support pattern SUP may have a fourth width W4 in the second direction D2. The fourth width W4 may be the same as or different from the third width W3 discussed above. For example, a ratio (W4/W3) of the fourth width W4 to the third width W3 may range from about 0.05 to about 0.2, and may be the same as, or different from the ratio W2/W1 described above with reference to FIG. 3A.

Figure 4:
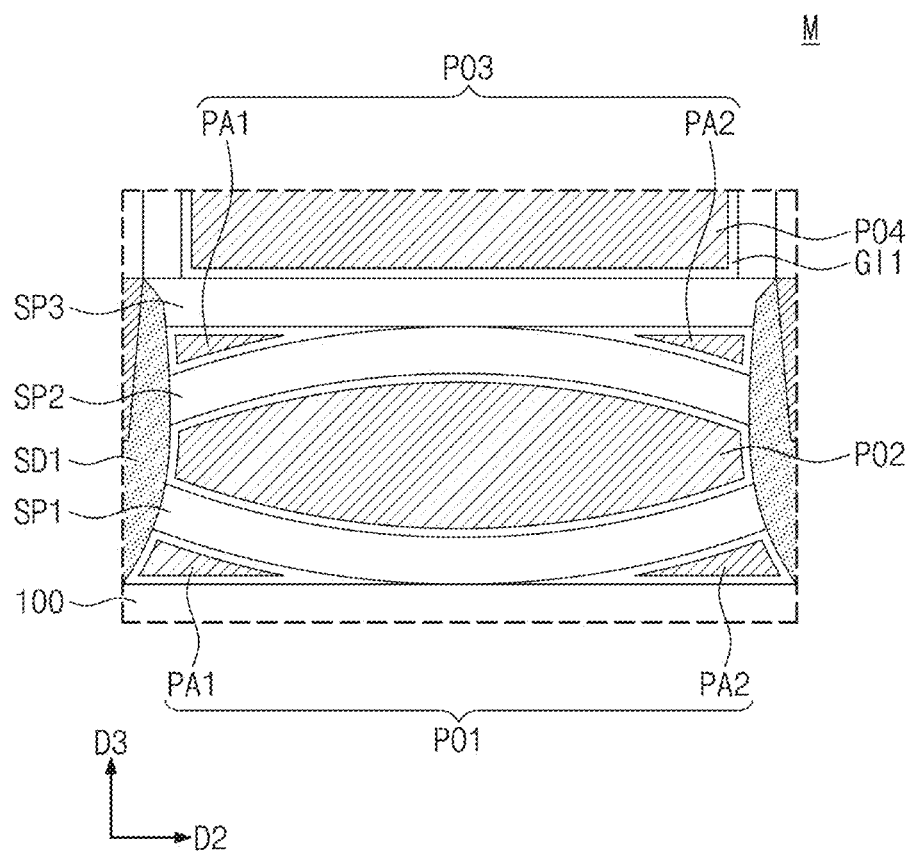
FIG. 4 illustrates a cross-sectional view that corresponds to that of section M depicted in FIG. 2A, showing a semiconductor device according to a comparative example of inventive concepts.
Figure 5:
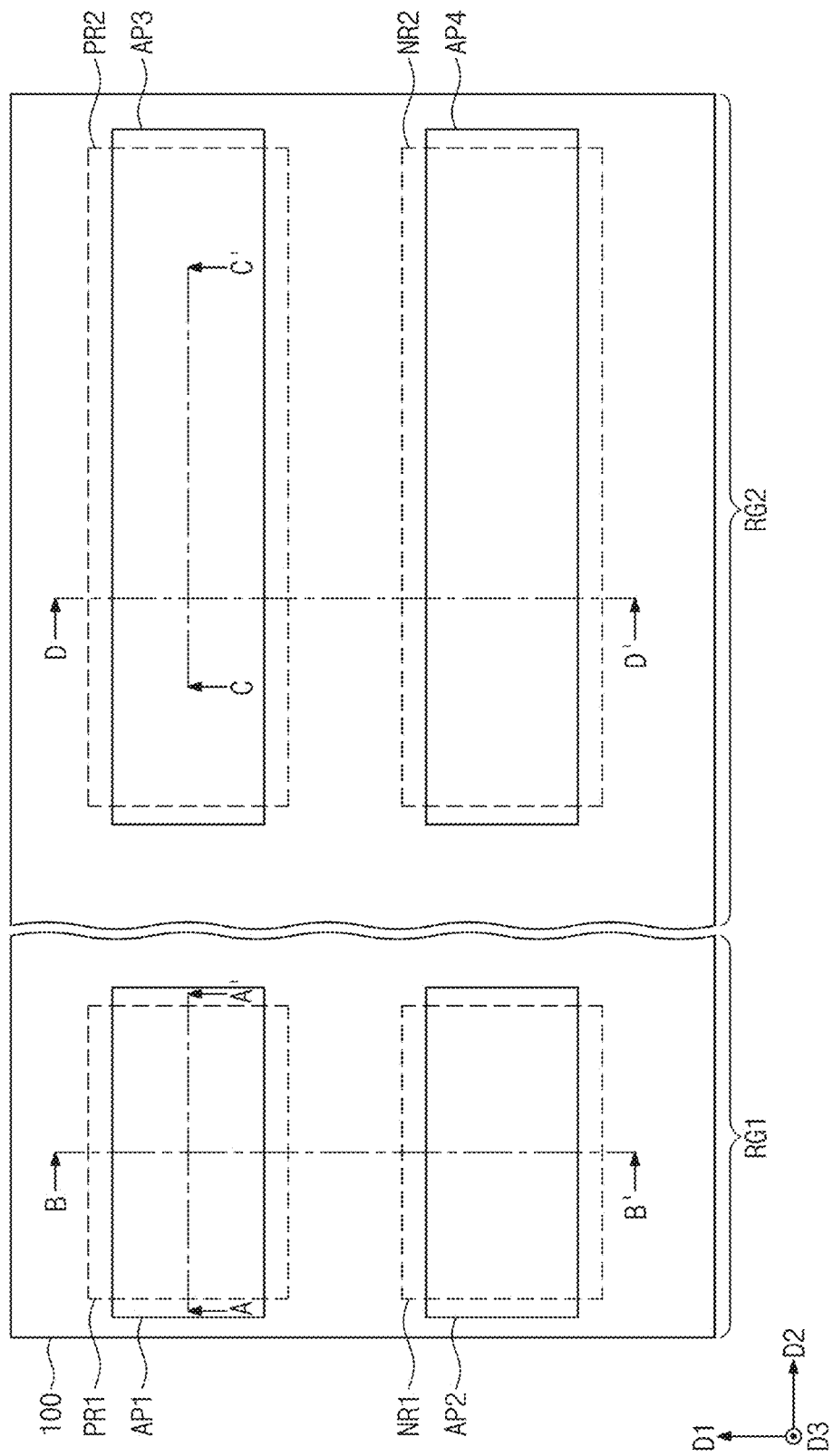
FIGS. 5, 7, 9, 11, 13, and 15 illustrate plan views showing a method of fabricating a semiconductor device according to some example embodiments of inventive concepts.
Figure 6A:
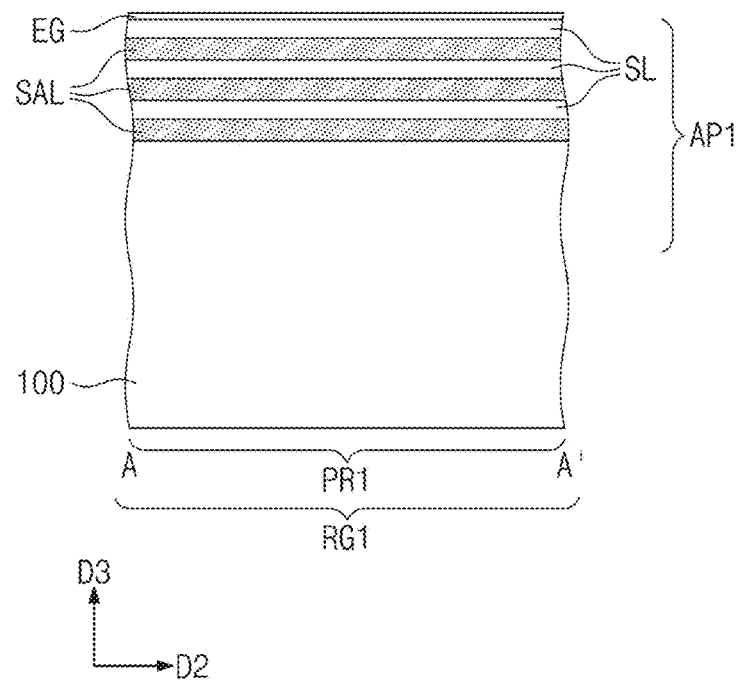
FIGS. 6A, 8A, 10A, 12A, 14A, and 16A illustrate cross-sectional views taken along line A-A' of FIGS. 5, 7, 9, 11, 13, and 15, respectively.
Figure 6B:
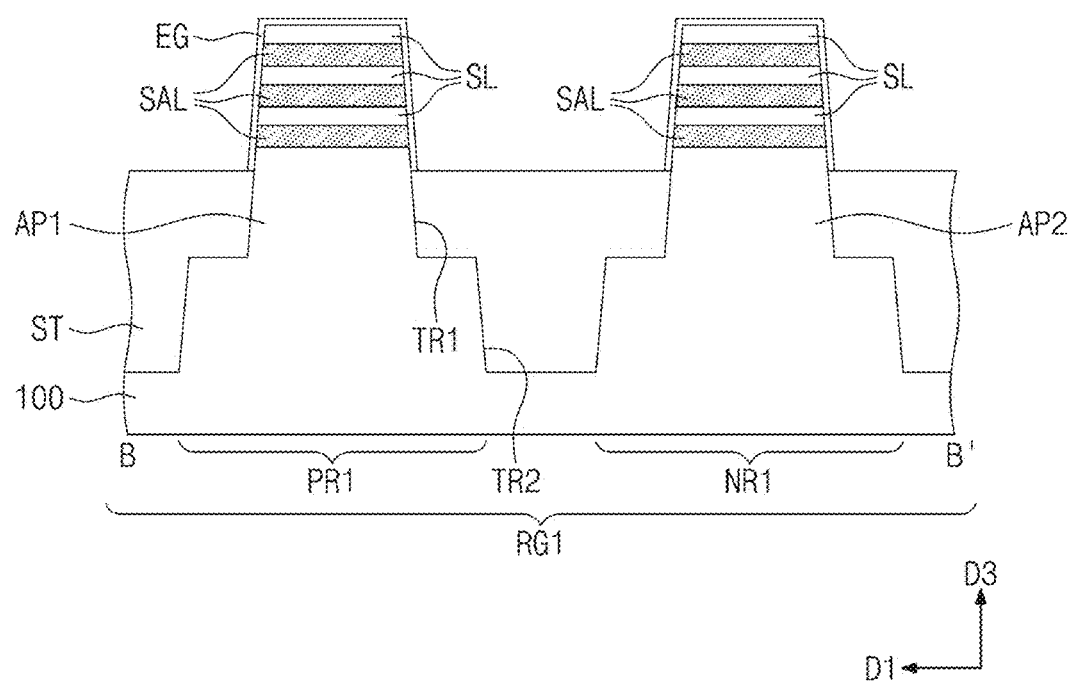
FIGS. 6B, 8B, 10B, 12B, 14B, and 16B illustrate cross-sectional views taken along line B-B' of FIGS. 5, 7, 9, 11, 13, and 15, respectively.
Figure 6C:
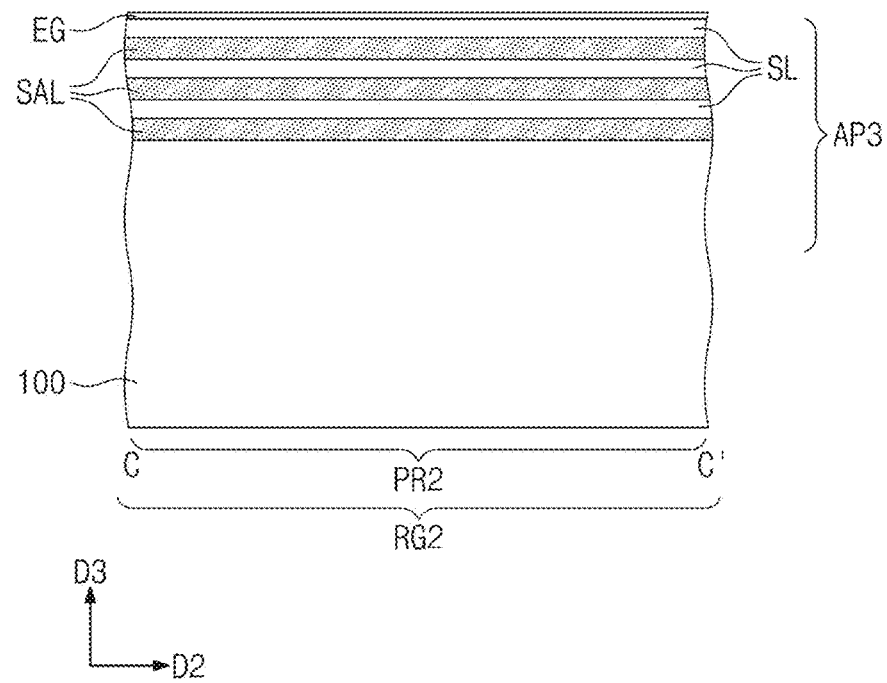
FIGS. 6C, 8C, 10C, 12C, 14C, and 16C illustrate cross-sectional views taken along line C-C' of FIGS. 5, 7, 9, 11, 13, and 15, respectively.
Figure 6D:
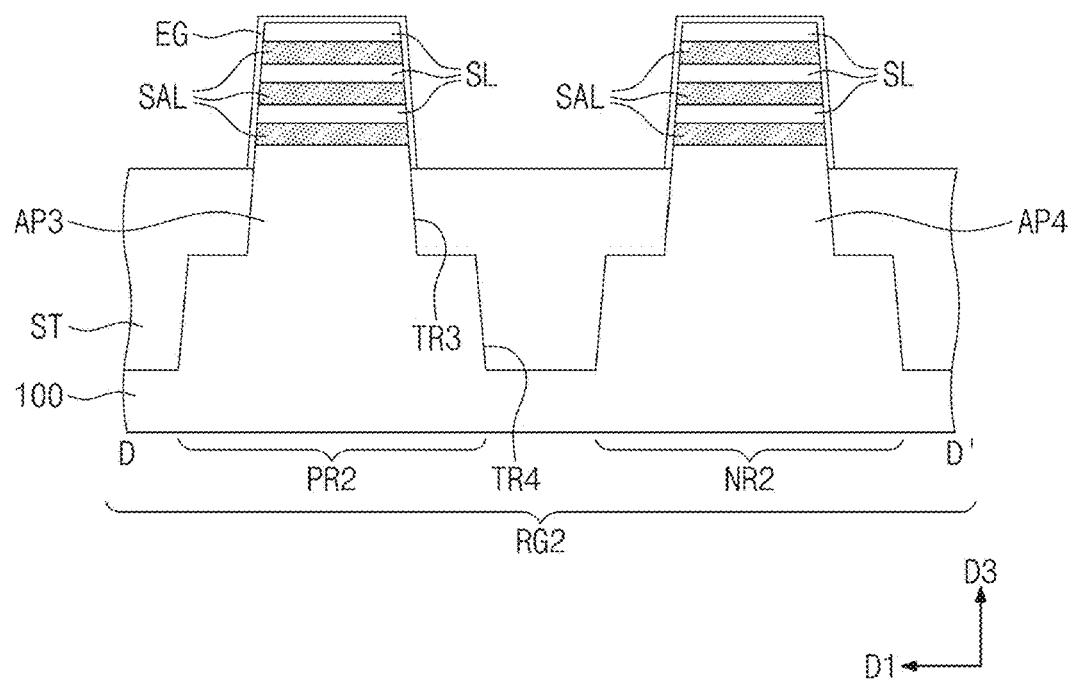
FIGS. 6D, 8D, 10D, 12D, 14D, and 16D cross-sectional views taken along line D-D' of FIGS. 5, 7, 9, 11, 13, and 15, respectively.
Figure 7:
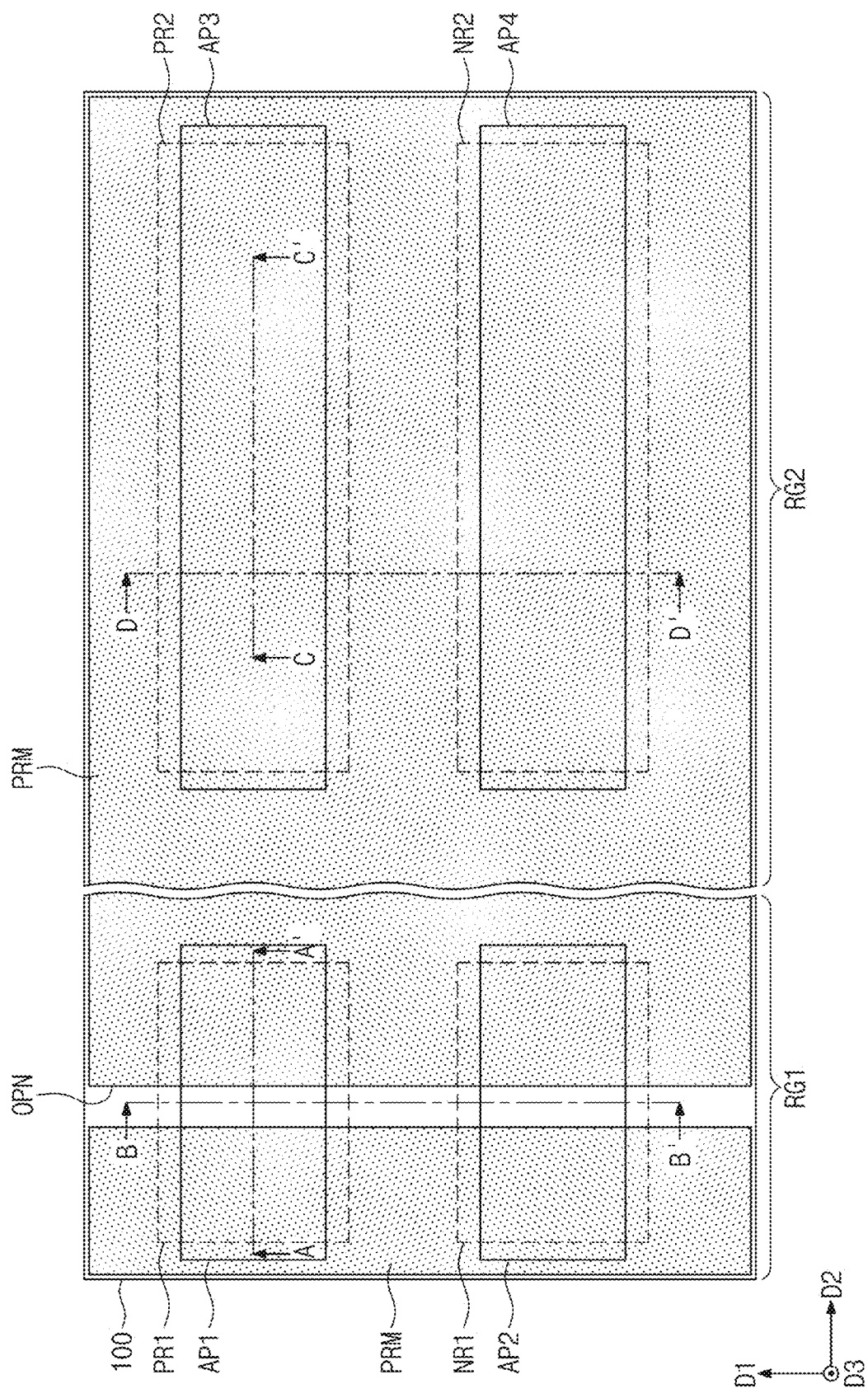
Figure 8A:
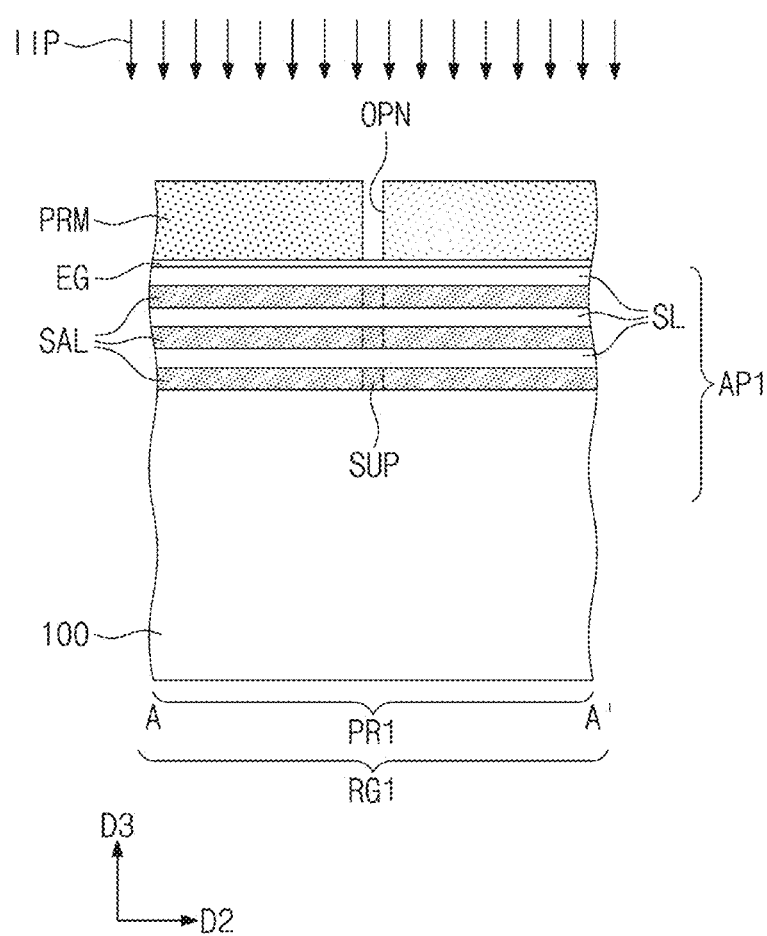
Figure 8B:
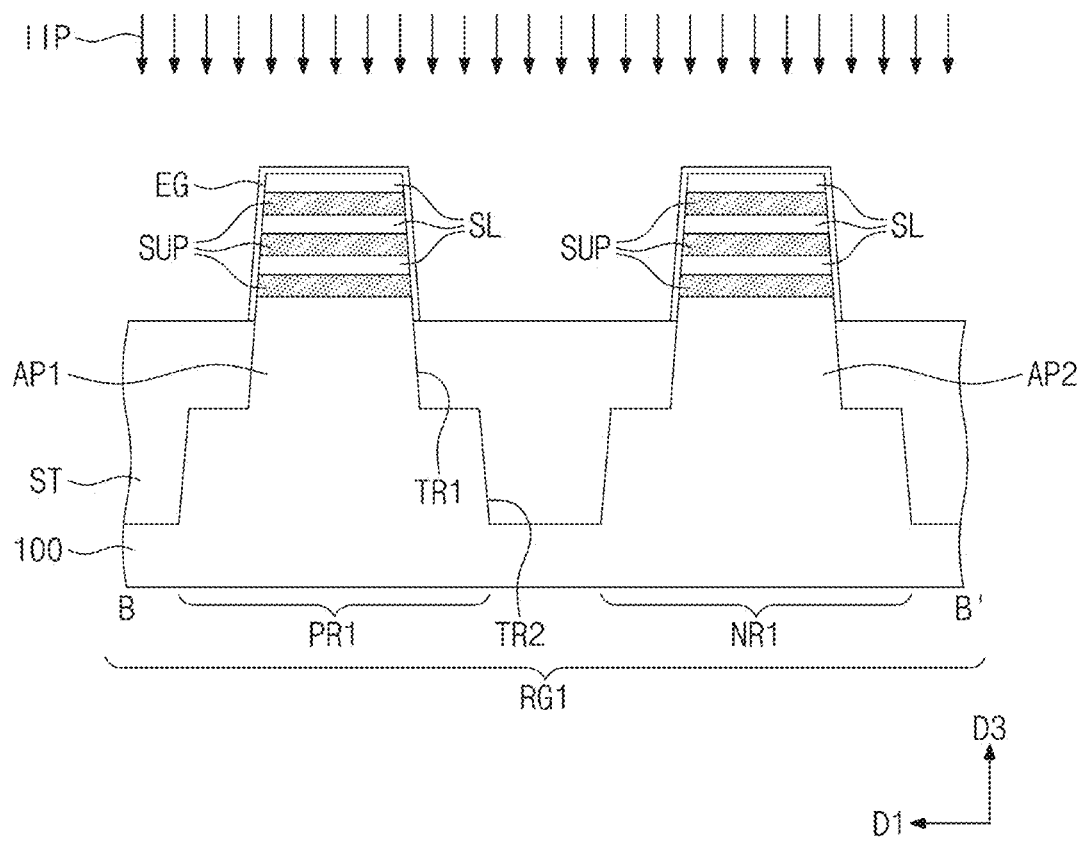
Figure 8C:
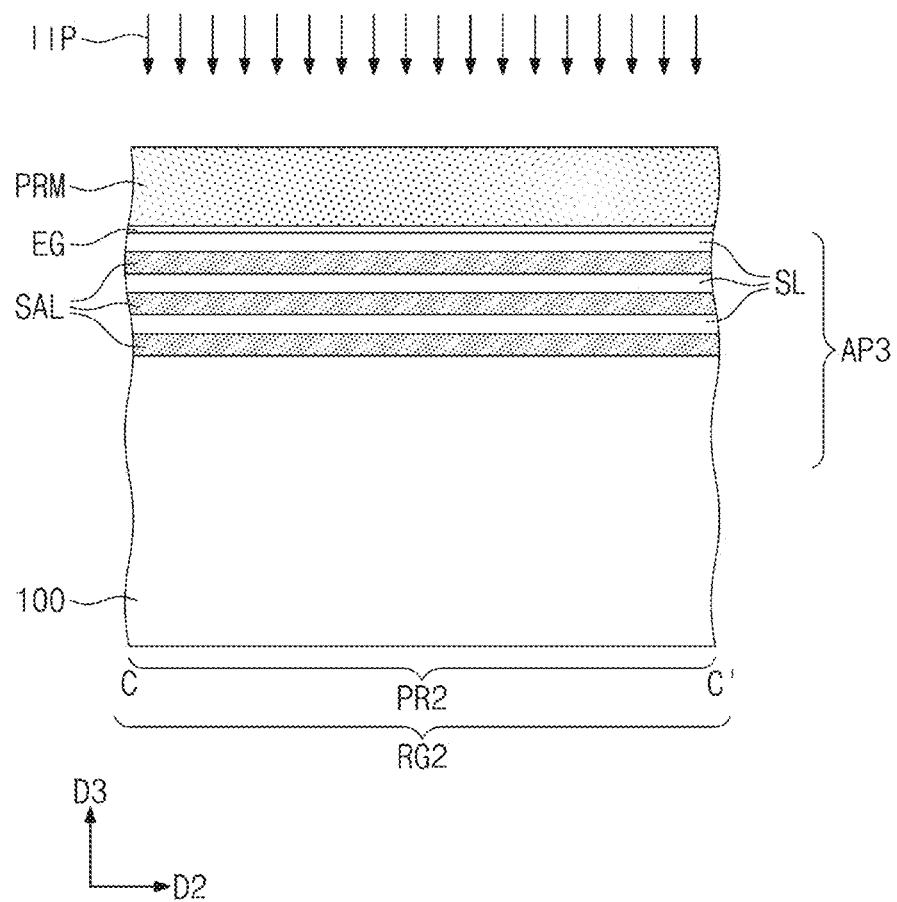
Figure 8D:
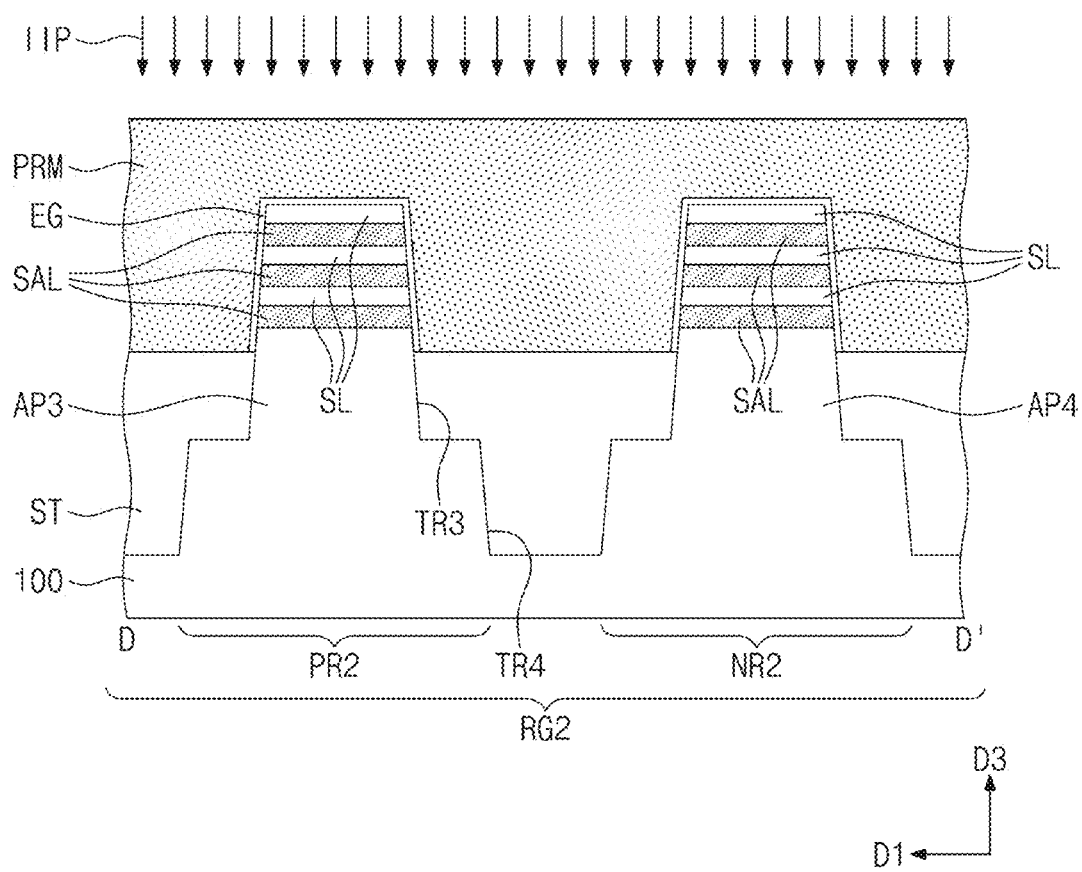
Figure 9:
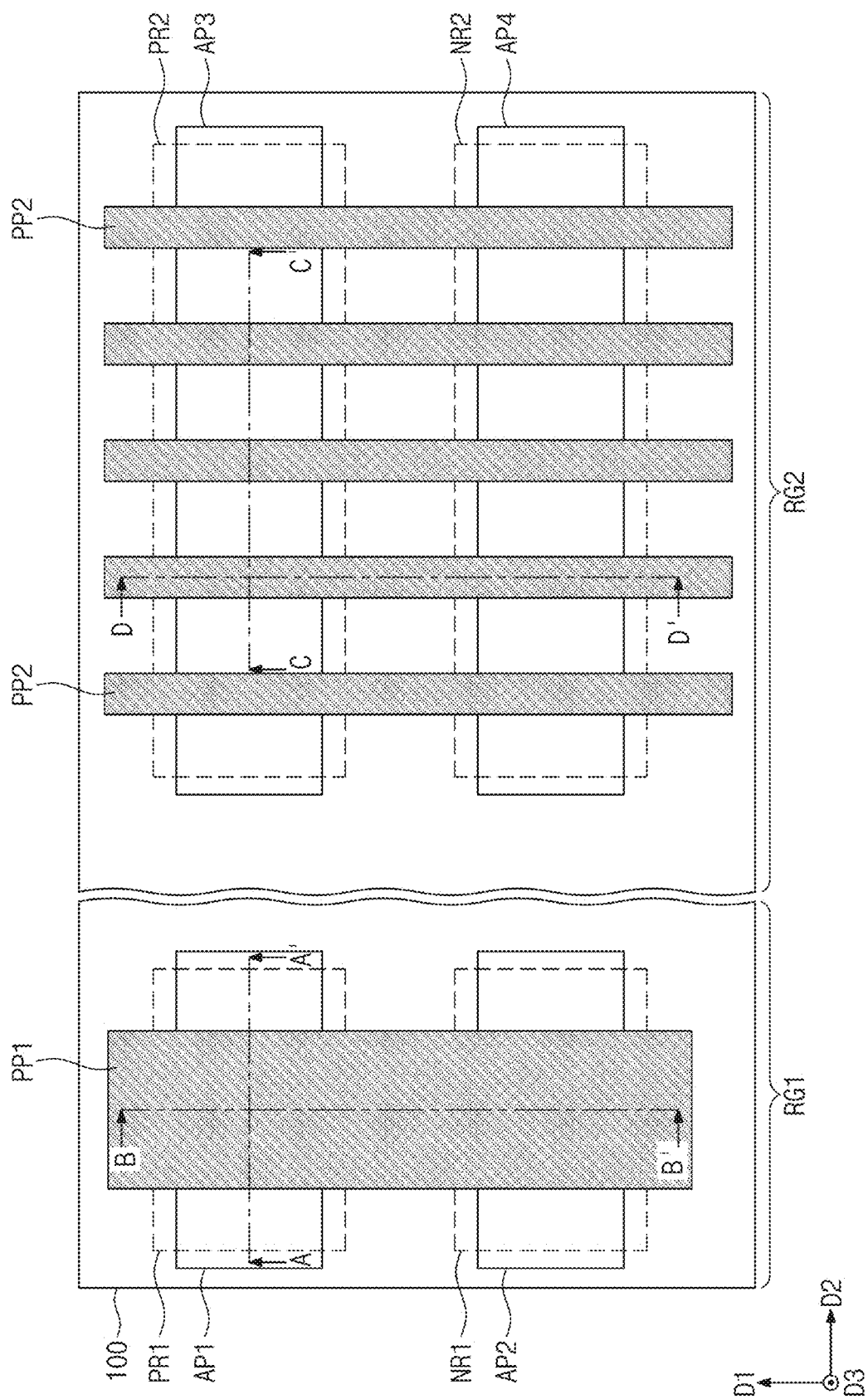
Figure 10A:
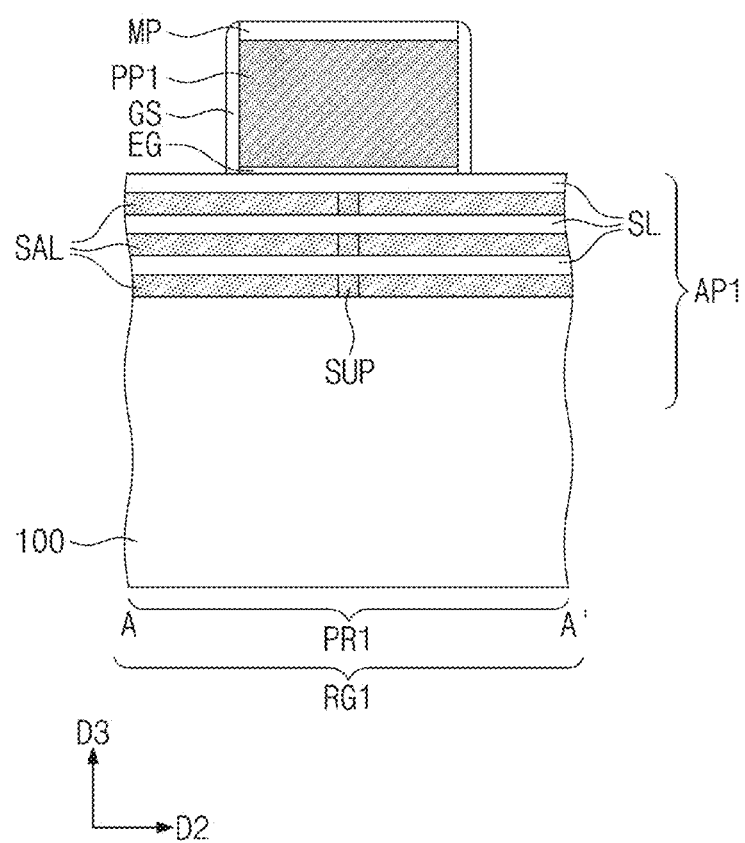
Figure 10B:
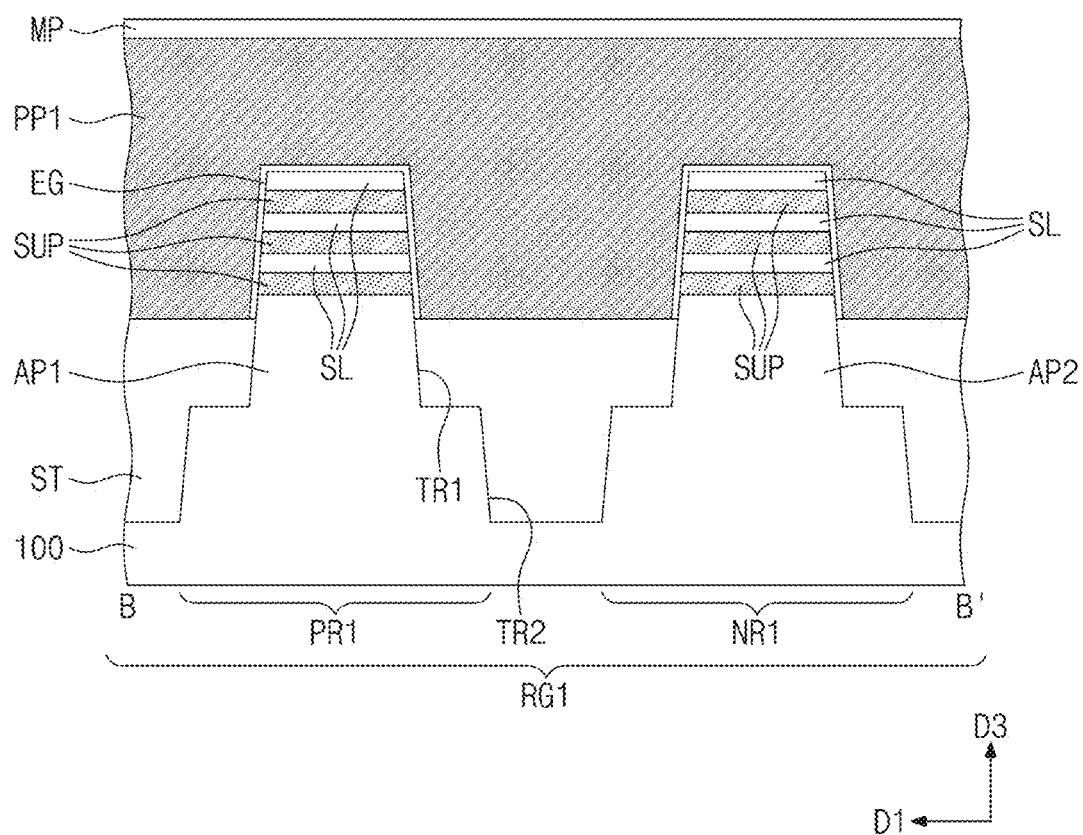
Figure 10C:
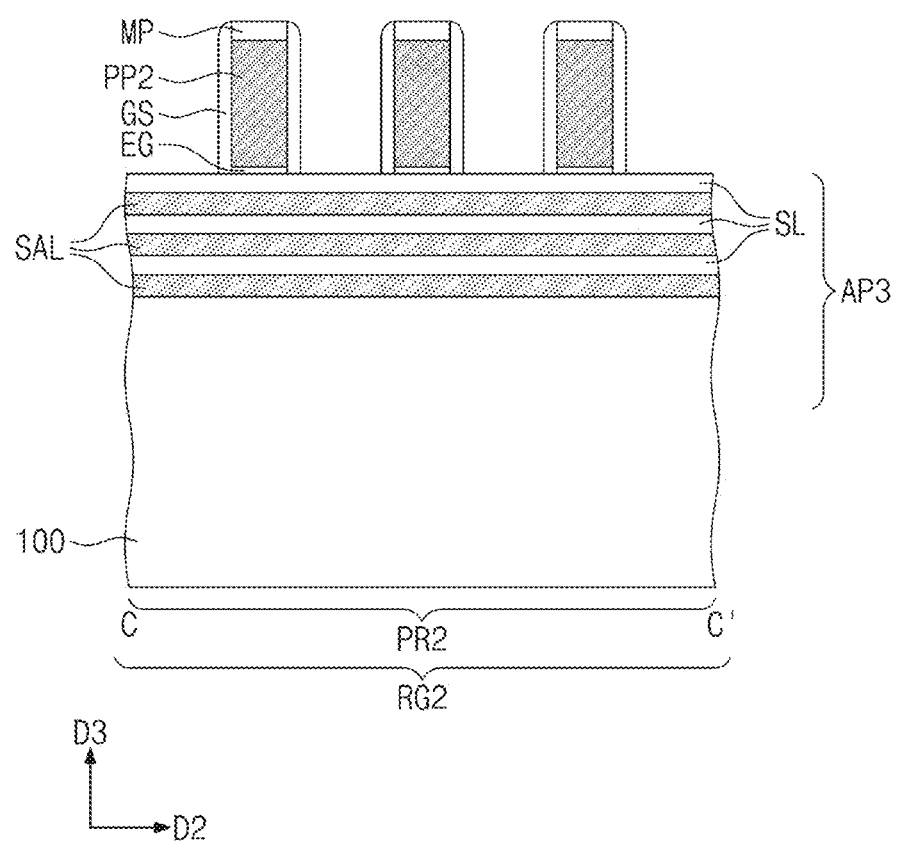
Figure 10D:
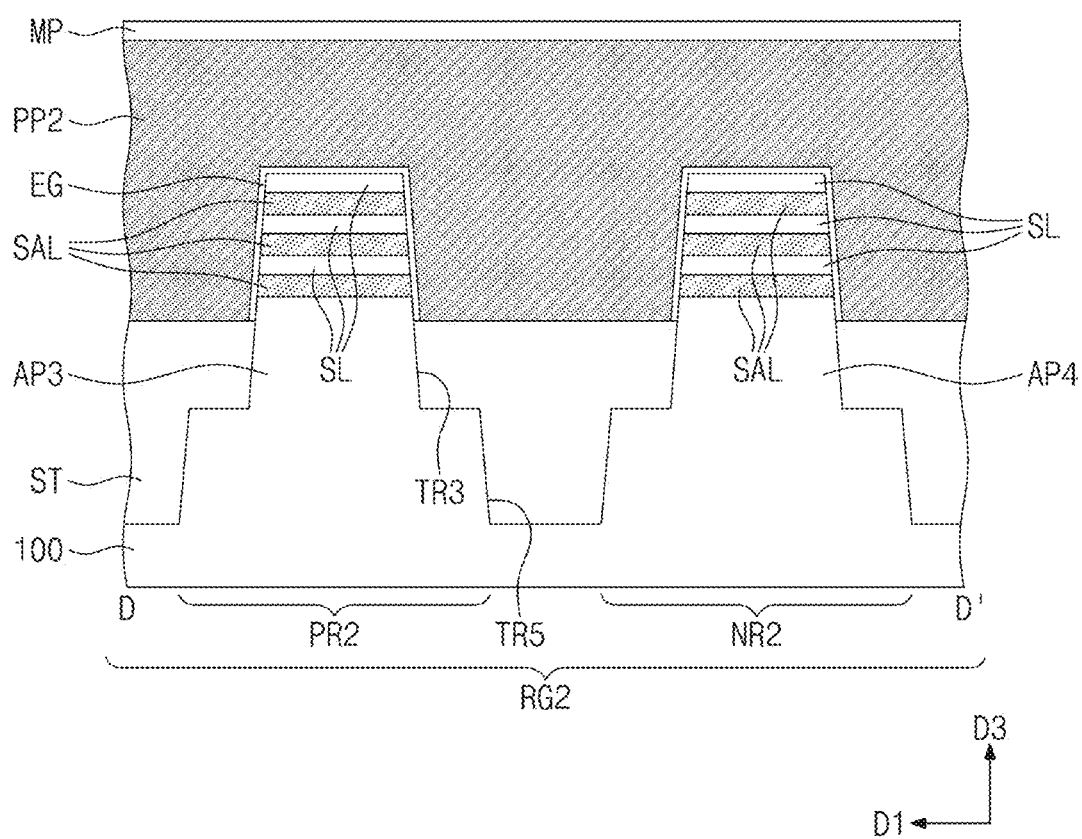
Figure 11:
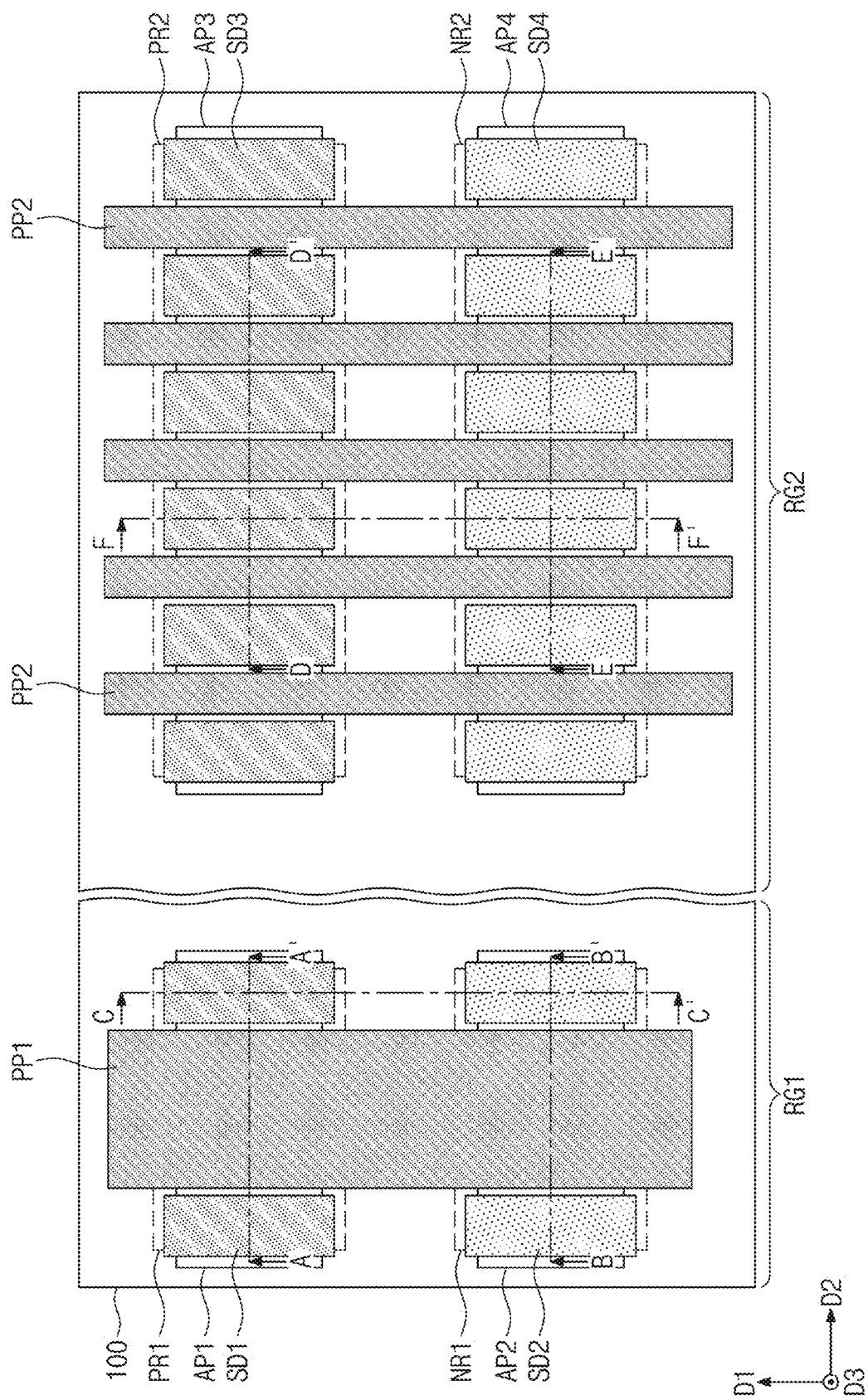

FIG. 4 illustrates a cross-sectional view that corresponds to that of section M shown in FIG. 2A, showing a semiconductor device according to a comparative example of inventive concepts.

Referring to FIG. 4, when the support patterns SUP are omitted between the first, second, and third semiconductor patterns SP1, SP2, and SP3, at least one selected from the first, second, and third semiconductor patterns SP1, SP2, and SP3 may become bent, e.g. may have a bow shape. For example, the first semiconductor pattern SP1 may be bent to contact the substrate 100, and/or the second semiconductor pattern SP2 may be bent to contact the third semiconductor pattern SP3.

Because the first, second, and third semiconductor patterns SP1, SP2, and SP3 on the first region RG1 are shorter than the first, second, and third semiconductor patterns SP1, SP2, and SP3 on the second region RG2, the omission of the support pattern SUP may cause structural instability. In this case, as shown in FIG. 4, a bending phenomenon/bowing phenomenon may occur in at least one selected from the first, second, and third semiconductor patterns SP1, SP2, and SP3. When the channel bending phenomenon occurs as illustrated in FIG. 4, a transistor may decrease in driving force (e.g. driving current) and/or electrical characteristics.

According to some example embodiments of inventive concepts, the support pattern SUP may be used such that a long channel transistor may be prevented, or reduced in likelihood, from bending at its channel (or, the first, second, and third semiconductor patterns SP1, SP2, and SP3). Therefore, it may be possible to provide a more uniform driving profiles/current profiles between long channel transistors, and/or to prevent or reduce the likelihood of deterioration in electrical characteristics.

Figure 12A:
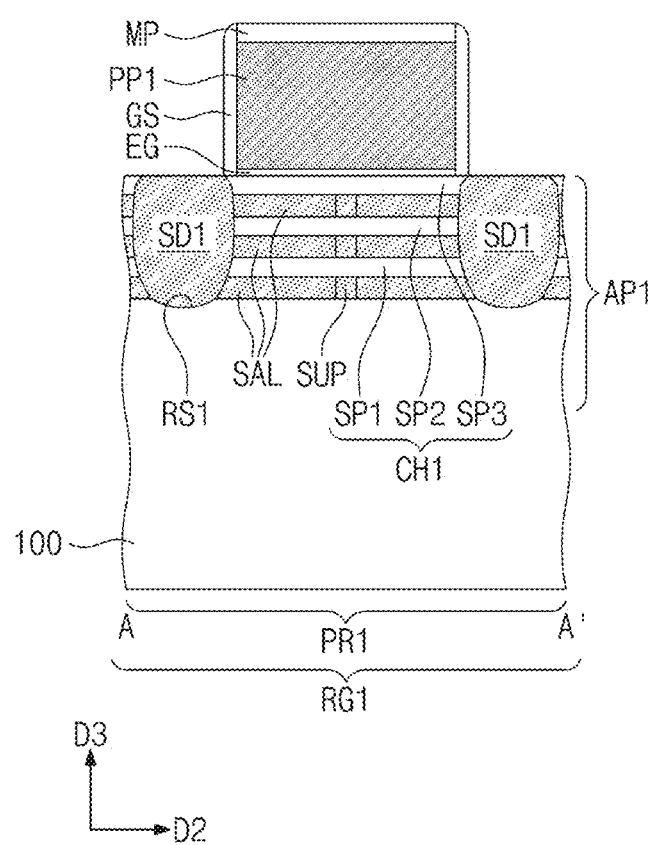
Figure 12B:
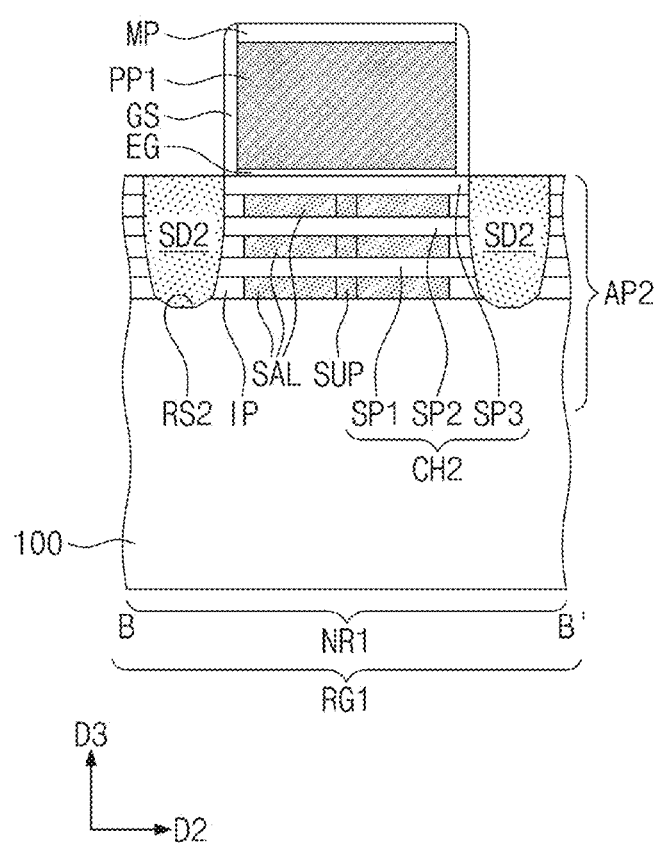
Figure 12C:
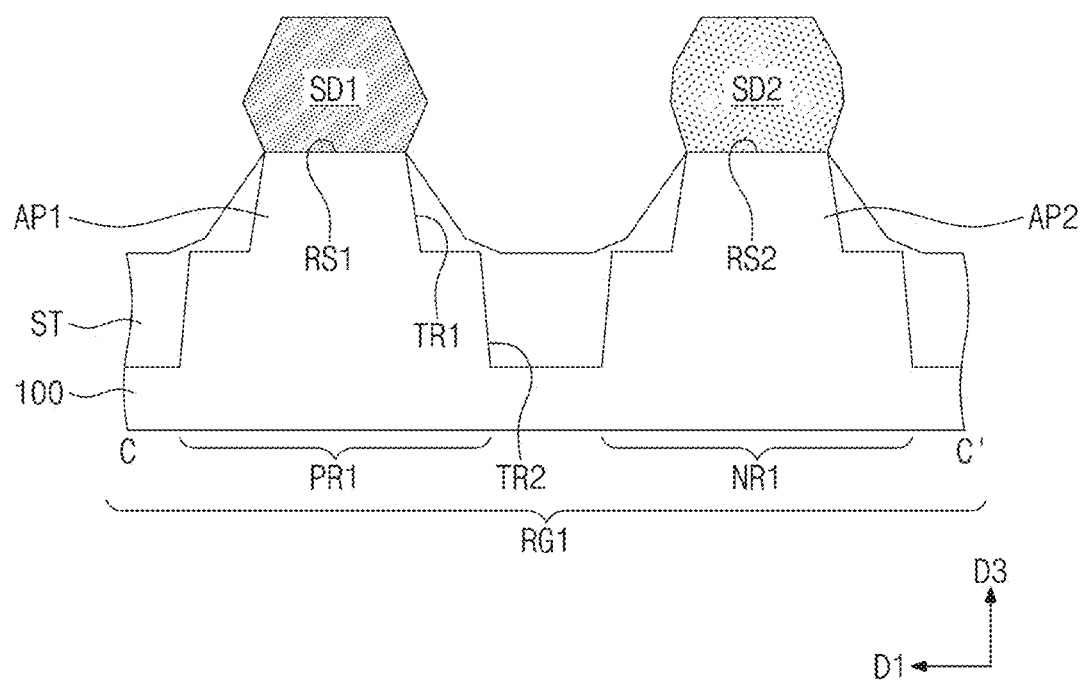
Figure 12D:
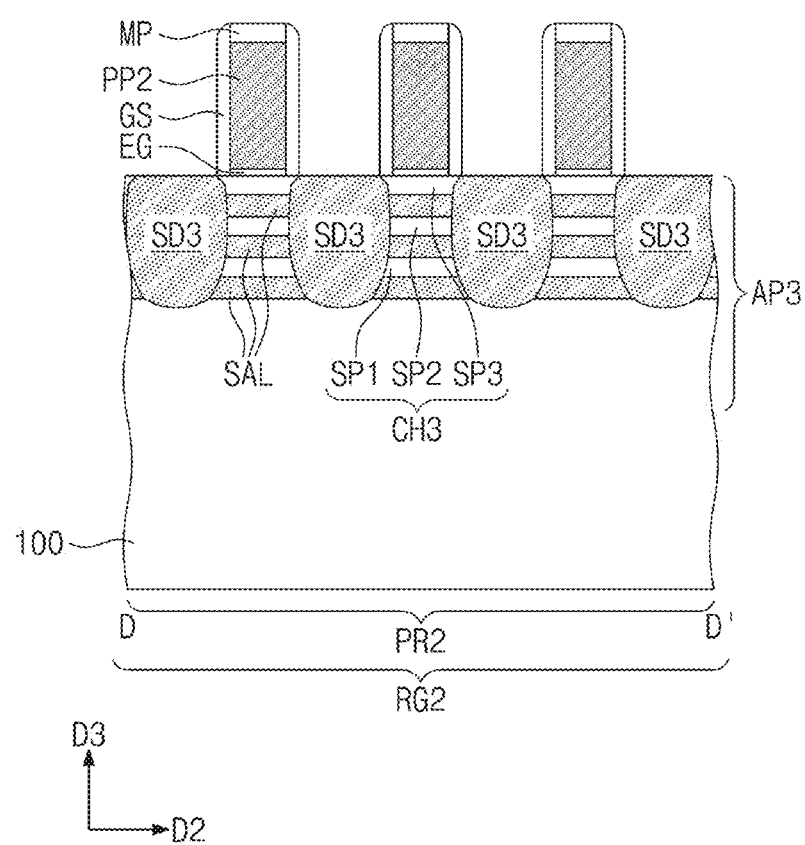
Figure 12E:
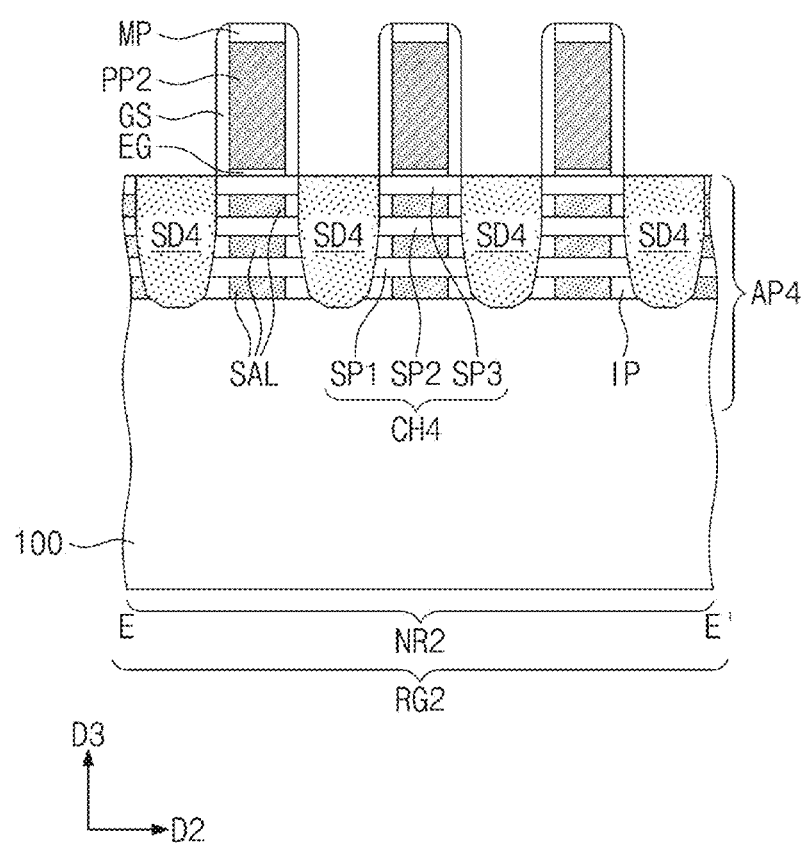
FIGS. 12E, 14E, and 16E illustrate cross-sectional views taken along line E-E' of FIGS. 11, 13, and 15, respectively.
Figure 12F:
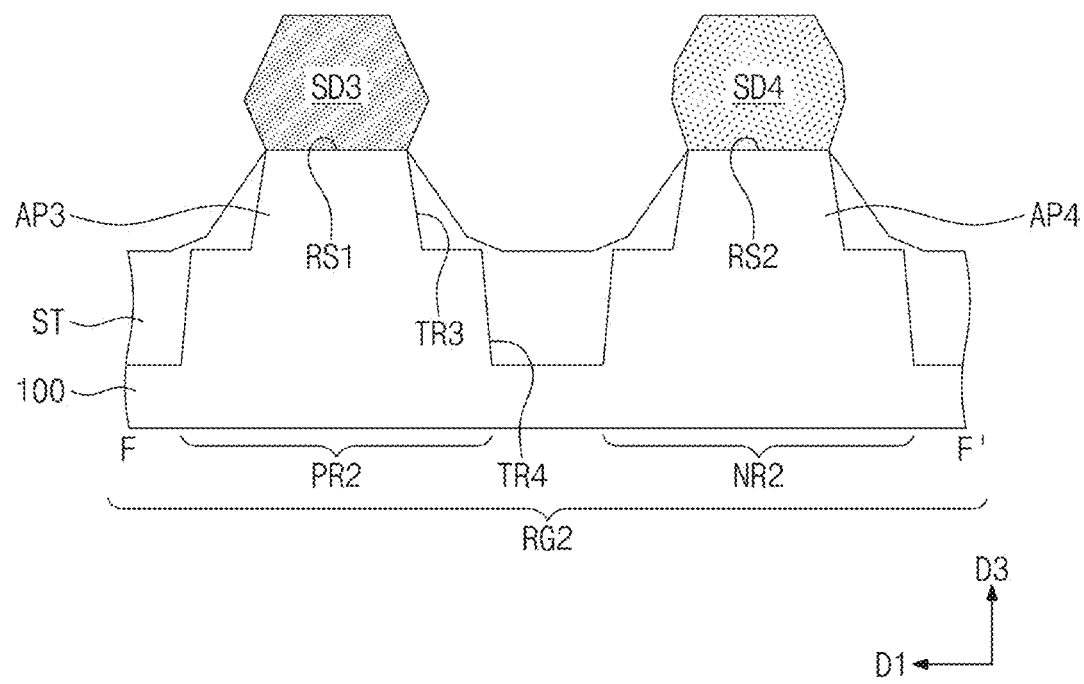
FIGS. 12F, 14F, and 16F illustrate cross-sectional views taken along line F-F' of FIGS. 11, 13, and 15, respectively.
Figure 13:
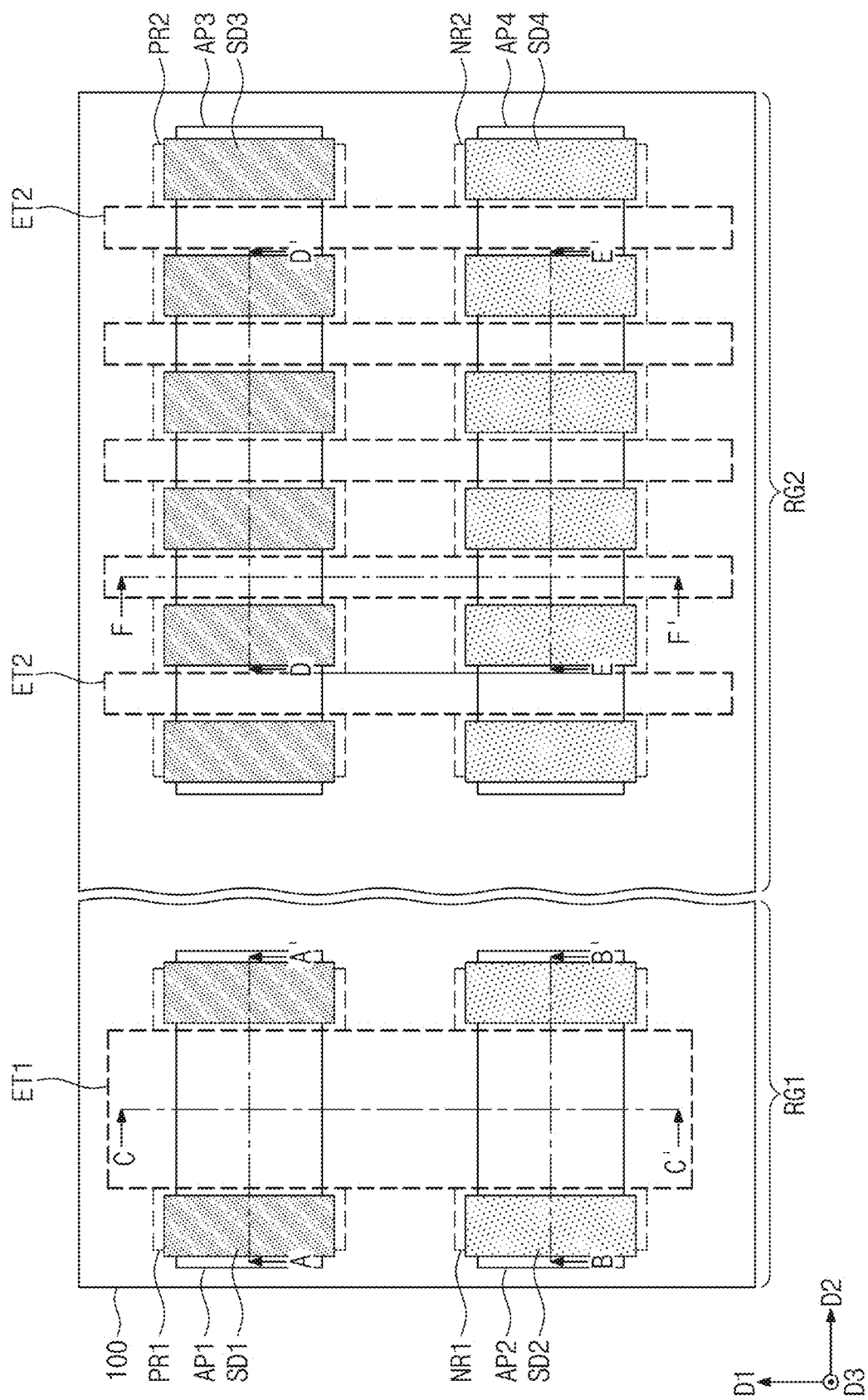
Figure 14A:
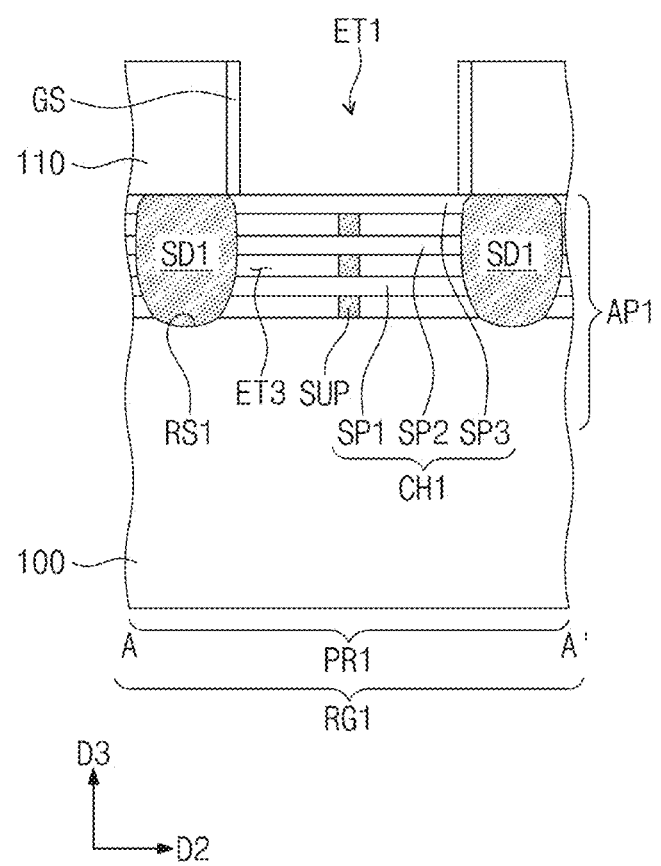
Figure 14B:
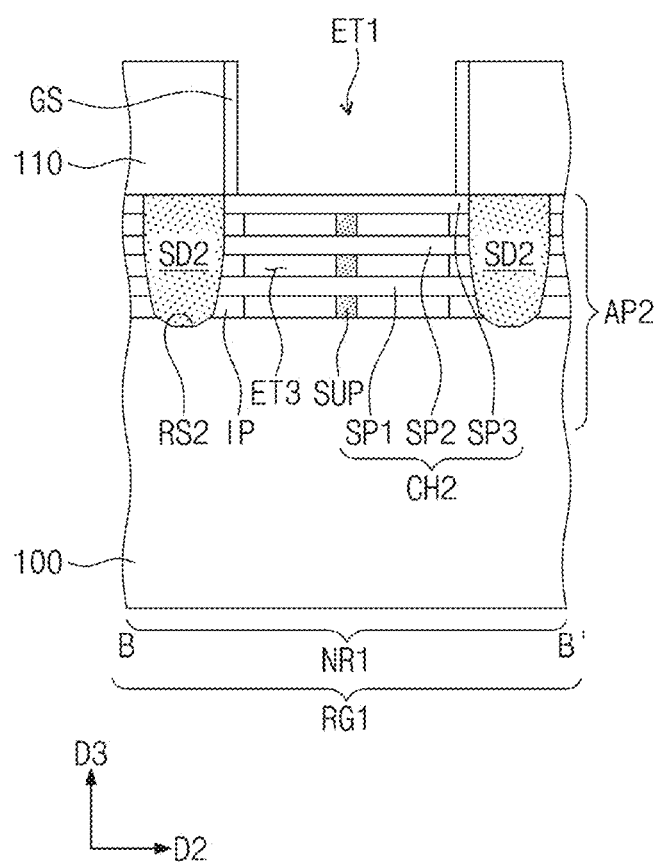
Figure 14C:
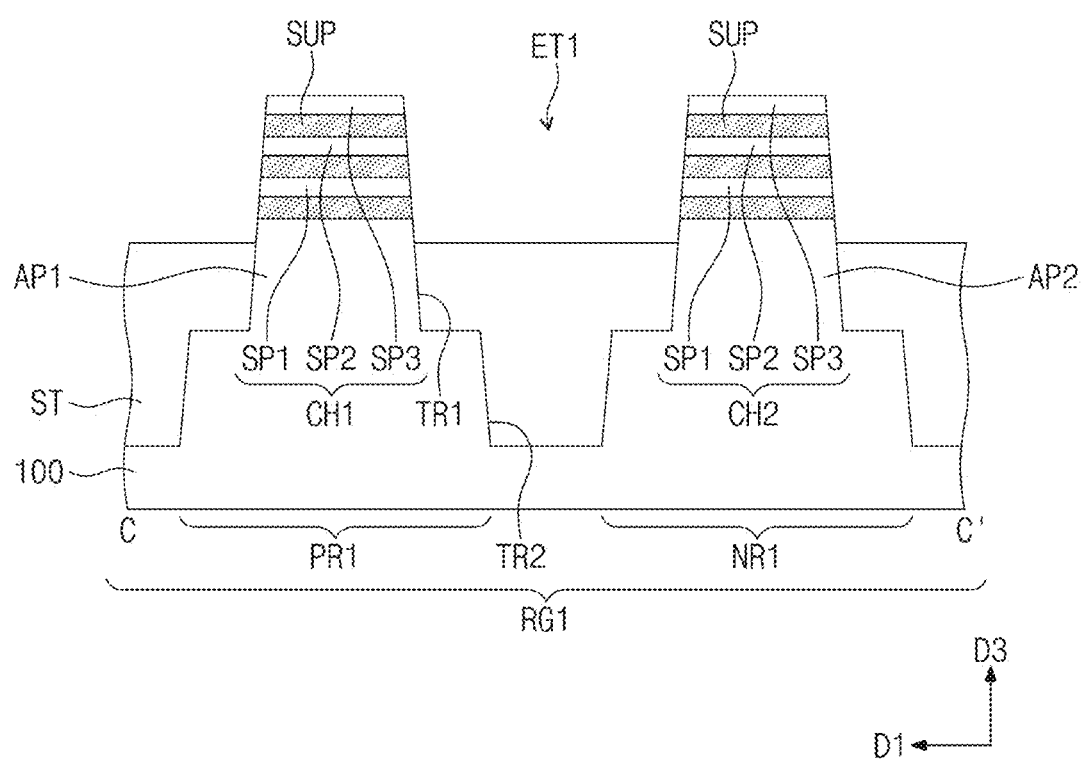
Figure 14D:
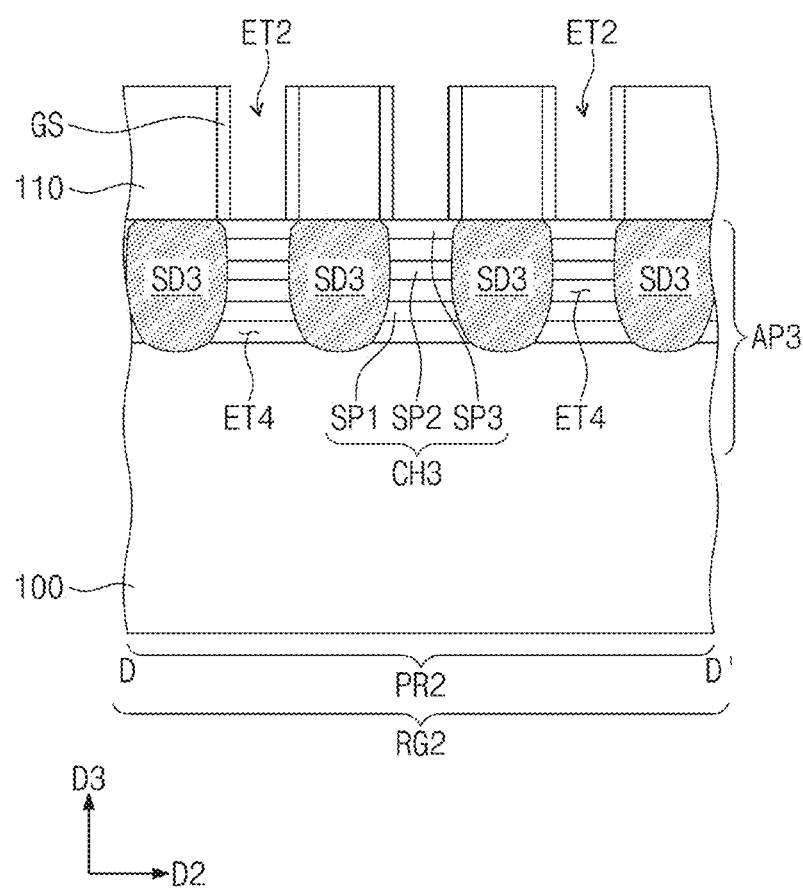
Figure 14E:
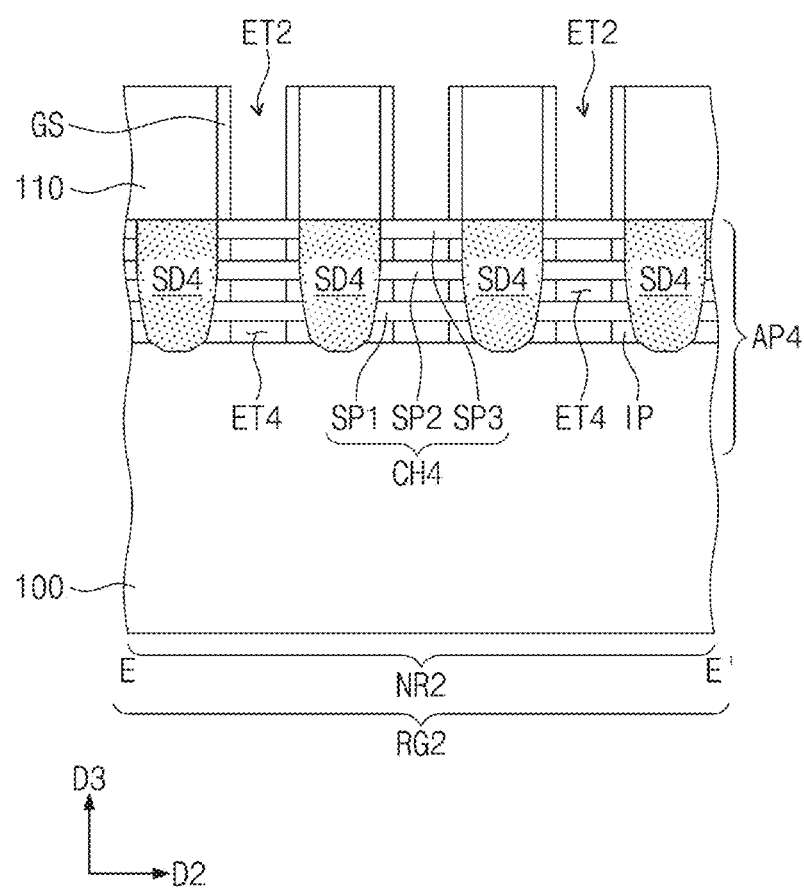
Figure 14F:
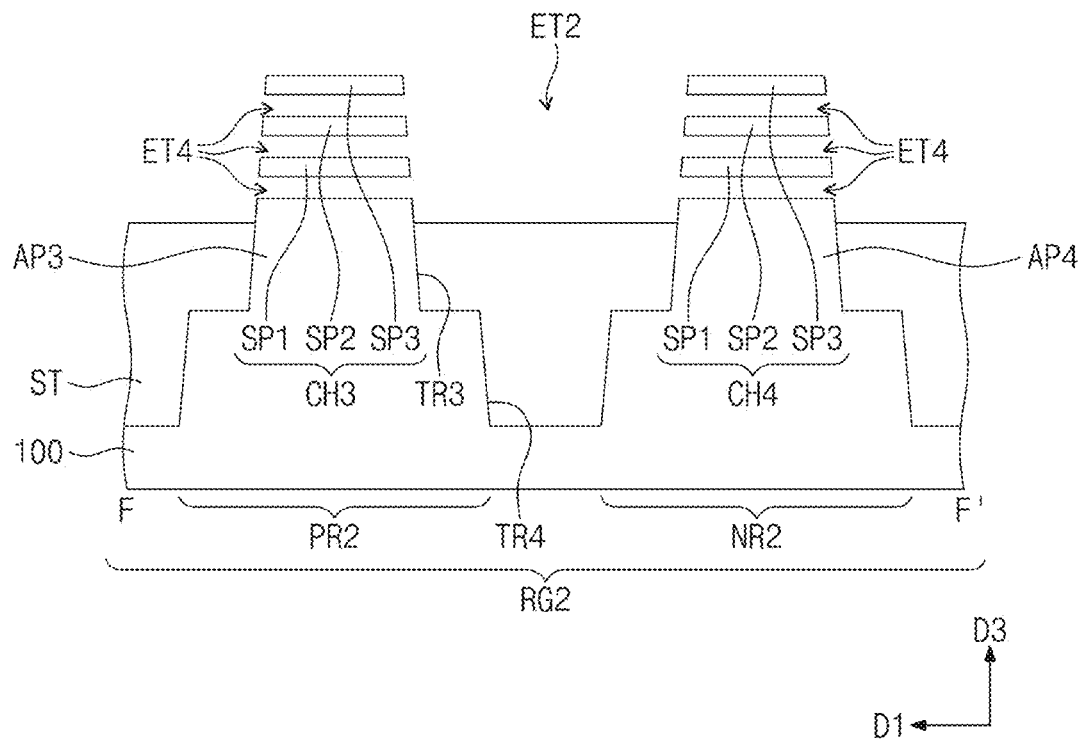
Figure 15:
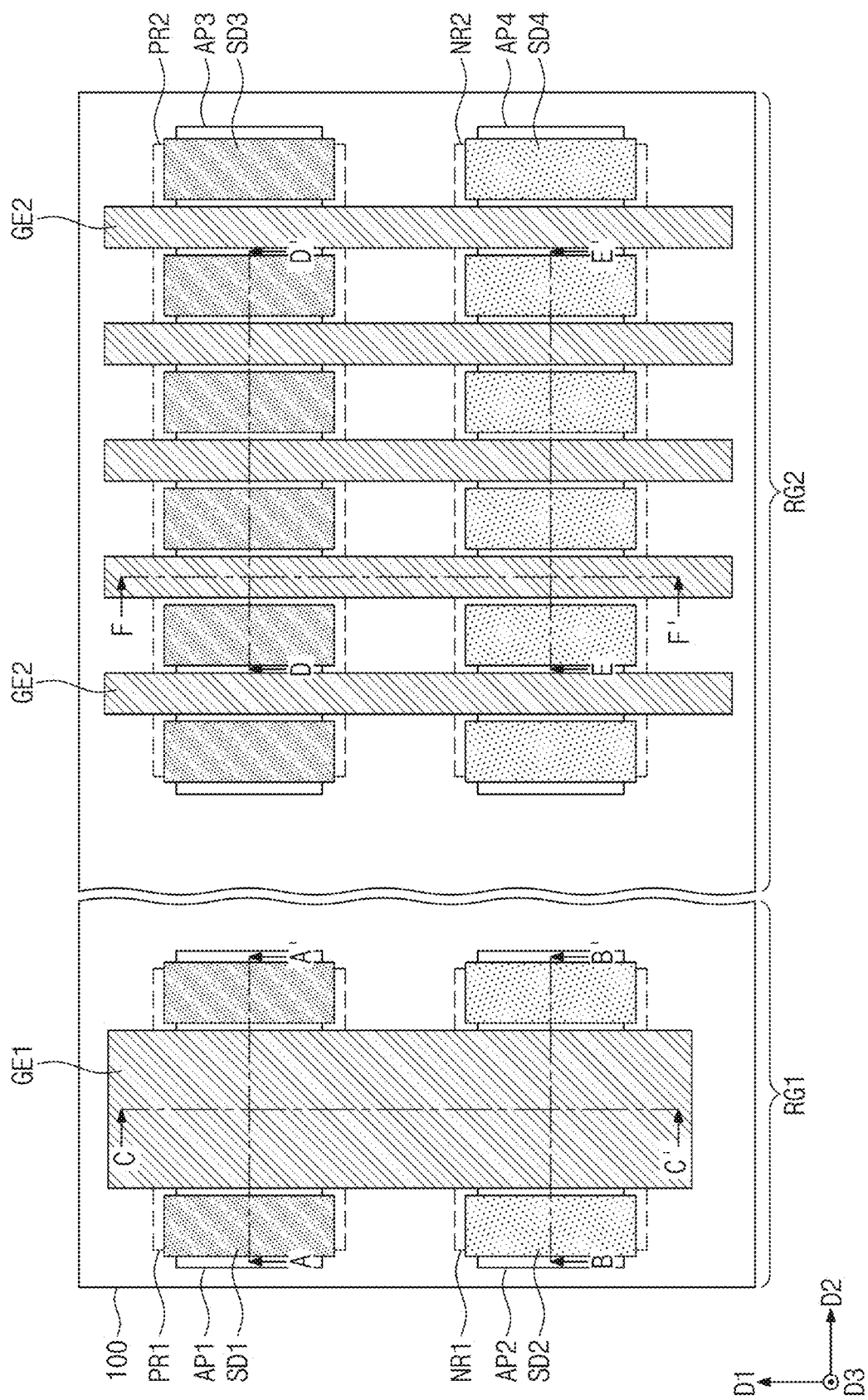
Figure 16A:
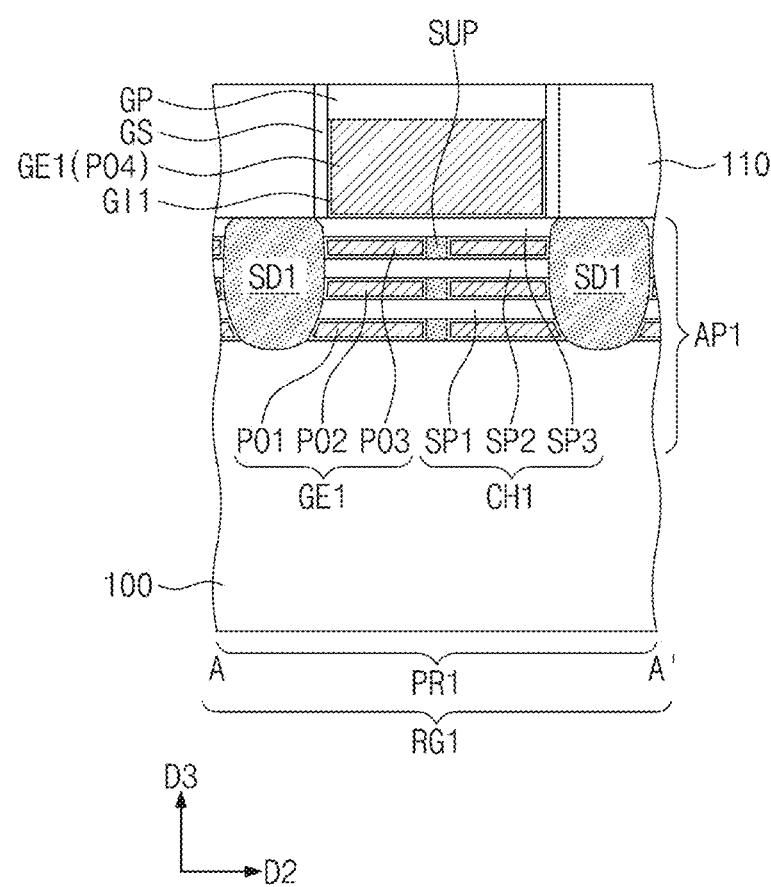
Figure 16B:
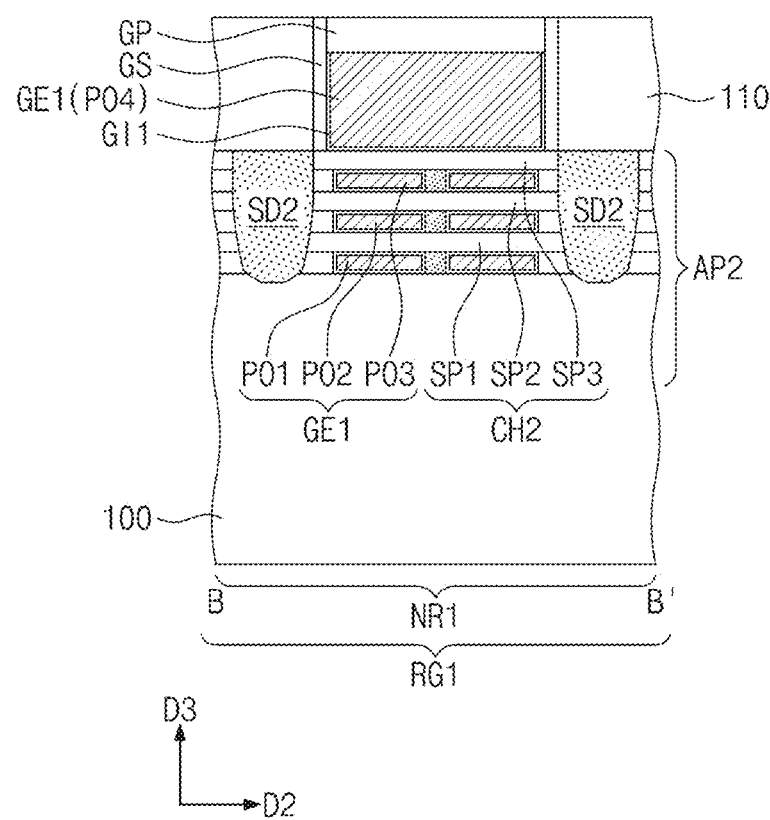
Figure 16C:
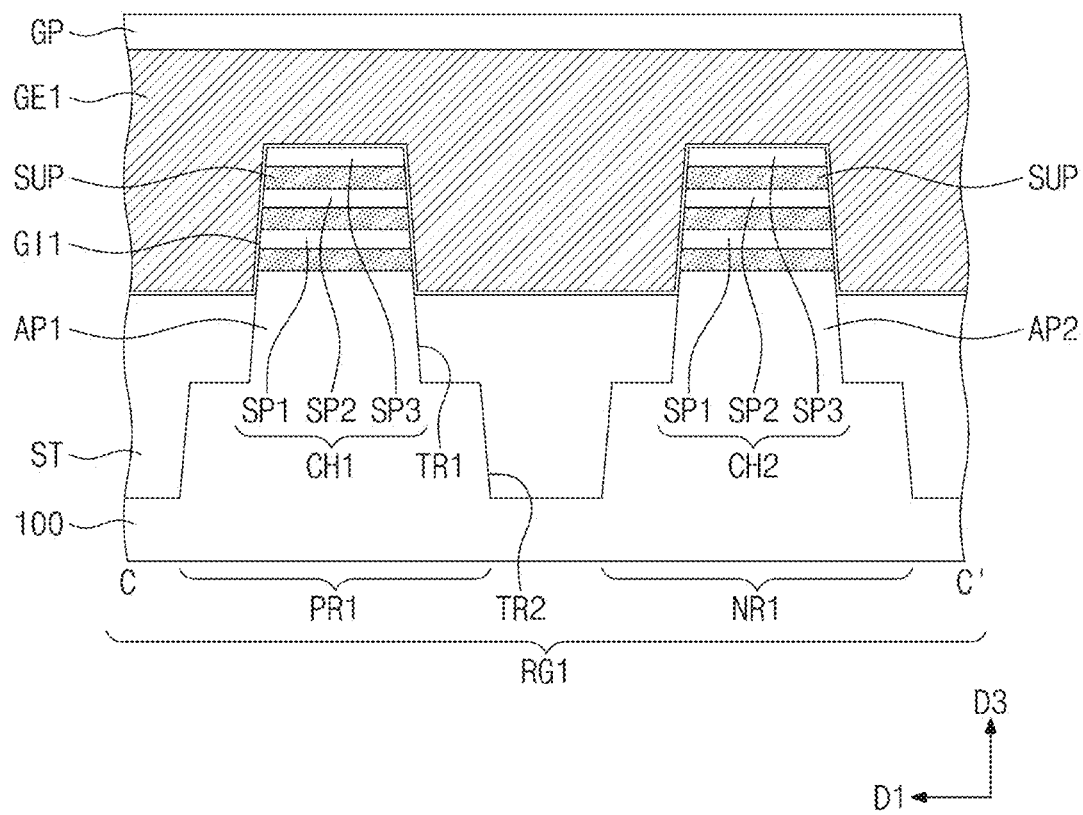
Figure 16D:
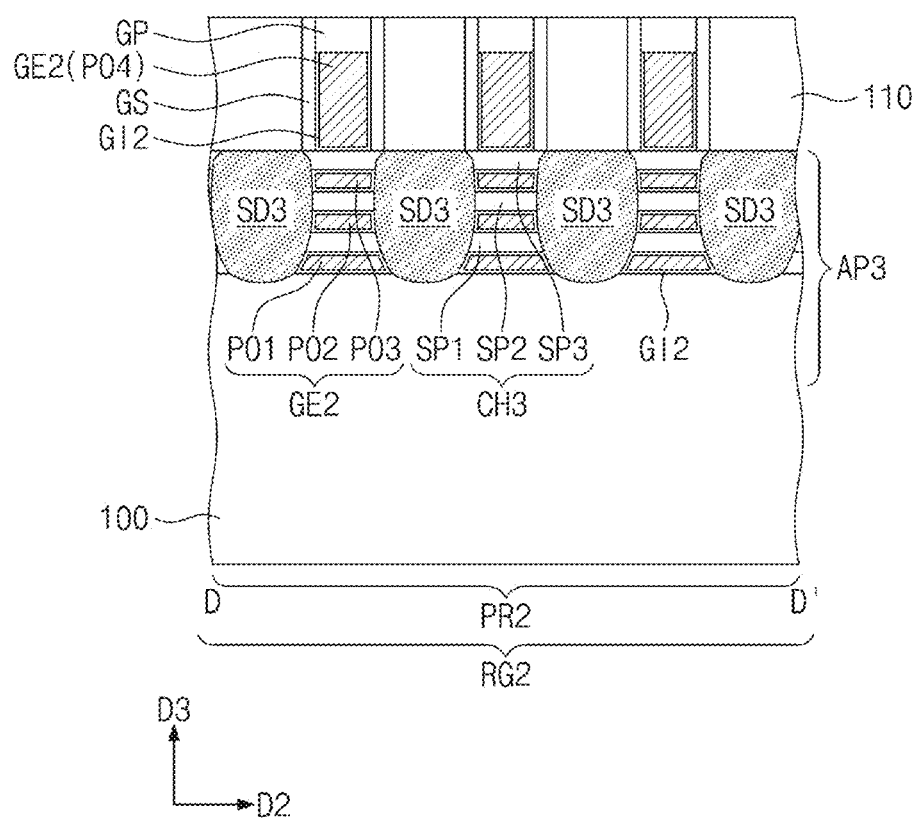
Figure 16E:
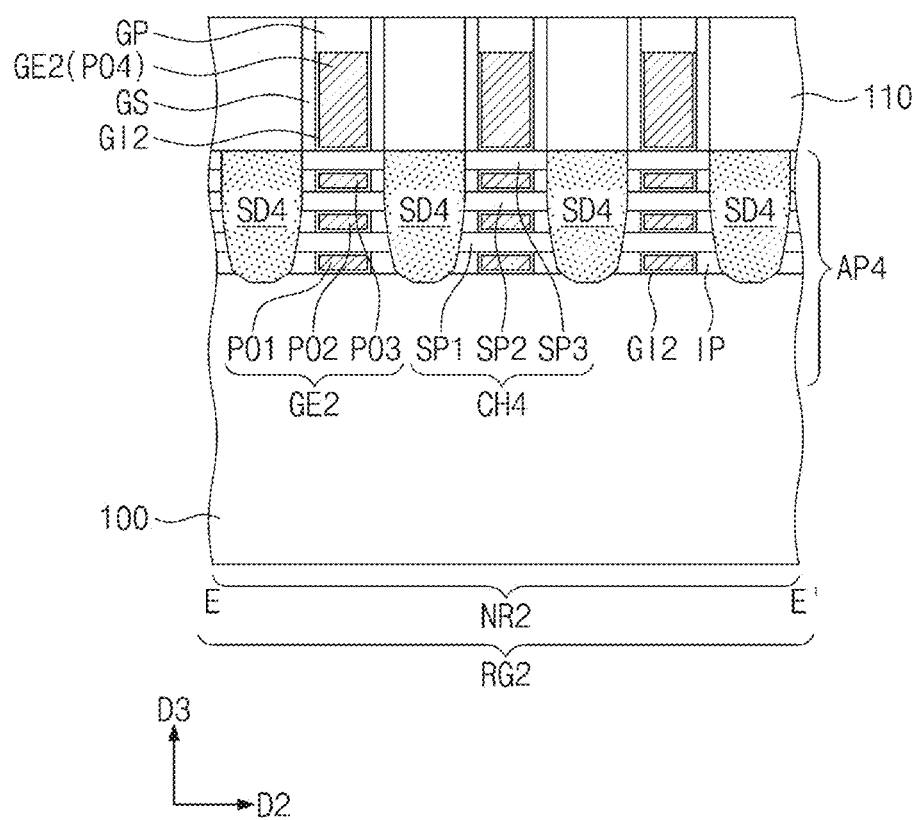
Figure 16F:
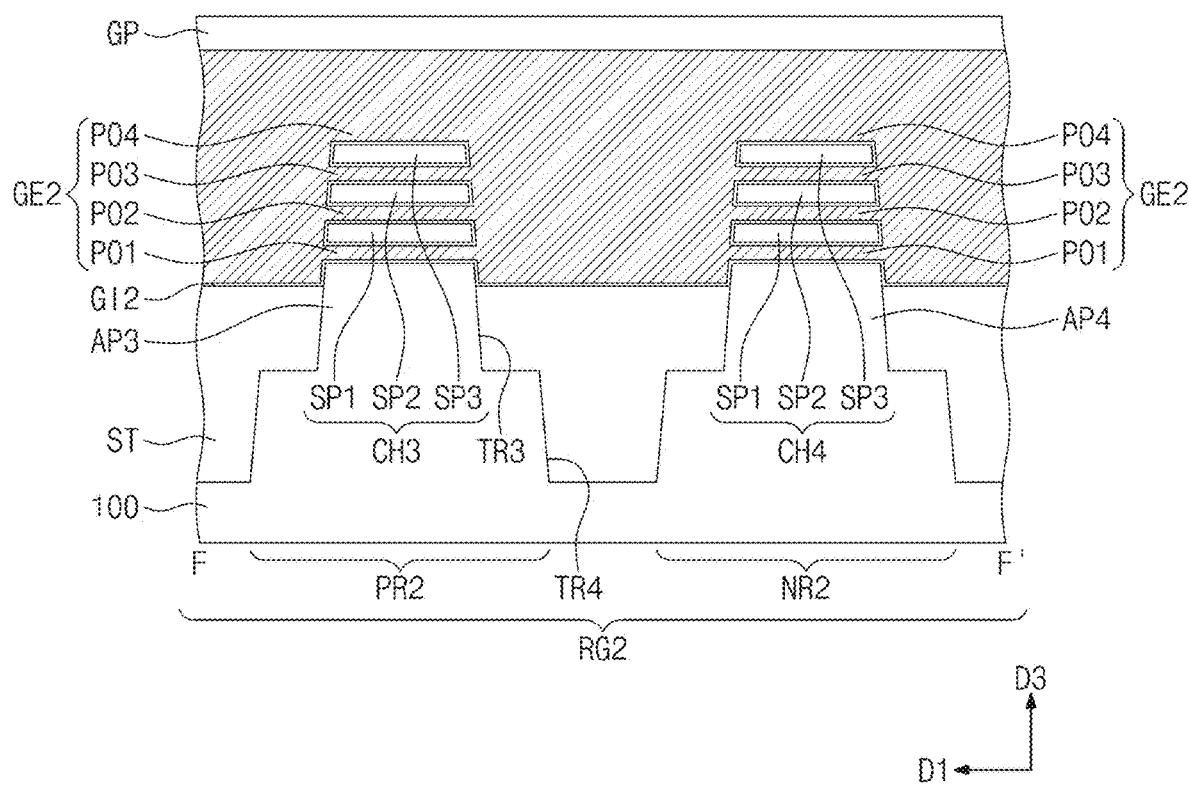

FIGS. 5, 7, 9, 11, 13, and 15 illustrate plan views showing a method of fabricating a semiconductor device according to some example embodiments of inventive concepts. FIGS. 6A, 8A, 10A, 12A, 14A, and 16A illustrate cross-sectional views taken along line A-A' of FIGS. 5, 7, 9, 11, 13, and 15, respectively. FIGS. 6B, 8B, 10B, 12B, 14B, and 16B illustrate cross-sectional views taken along line B-B' of FIGS. 5, 7, 9, 11, 13, and 15, respectively. FIGS. 6C, 8C, 10C, 12C, 14C, and 16C illustrate cross-sectional views taken along line C-C' of FIGS. 5, 7, 9, 11, 13, and 15, respectively. FIGS. 6D, 8D, 10D, 12D, 14D, and 16D cross-sectional views taken along line D-D' of FIGS. 5, 7, 9, 11, 13, and 15, respectively. FIGS. 12E, 14E, and 16E illustrate cross-sectional views taken along line E-E' of FIGS. 11, 13, and 15, respectively. FIGS. 12F, 14F, and 16F illustrate cross-sectional views taken along line F-F' of FIGS. 11, 13, and 15, respectively.

Referring to FIGS. 5 and 6A to 6D, a substrate 100 may be provided which includes a first region RG1 and a second region RG2. Semiconductor layers SL and sacrificial layers SAL may be formed alternately stacked on the substrate 100, and may be formed with a chemical vapor deposition (CVD) process and/or with an atomic layer deposition (ALD) process. The semiconductor layers SL may include one of silicon (Si), germanium (Ge), and silicon-germanium (Ge), and the sacrificial layers SAL may include another of silicon (Si), germanium (Ge), and silicon-germanium (Ge). For example, the semiconductor layers SL may include silicon (Si), and the sacrificial layers SAL may include silicon-germanium (SiGe). The sacrificial layers SAL may each have a germanium (Ge) concentration of about 10 at % to about 35 at %.

The substrate 100 may undergo a first patterning process to form a first trench TR1 that defines first, second, third, and fourth active patterns AP1, AP2, AP3, and AP4. The semiconductor layers SL and the sacrificial layers SAL may be patterned during the first patterning process. For example, each of the first to fourth active patterns AP1 to AP4 may include the semiconductor layers SL and the sacrificial layers SAL that are alternately stacked on the substrate 100. The first patterning process may include a photolithography process and an etching process such as a dry etching process.

The substrate 100 may undergo a second patterning process to form a second trench TR2 that defines a first PMOSFET region PR1, a first NMOSFET region NR1, a second PMOSFET region PR2, and a second NMOSFET region NR2. The second trench TR2 may be formed deeper than the first trench TR1. The second patterning process may include a photolithography process and an etching process such as a dry etching process. In some example embodiments of inventive concepts, it may be possible to omit the second patterning process for forming the second trench TR2.

The first region RG1 may include the first PMOSFET region PR1 and the first NMOSFET region NR1. The first active pattern AP1 and the second active pattern AP2 may be respectively formed on the first PMOSFET region PR1 and the first NMOSFET region NR1. The second region RG2 may include the second PMOSFET region PR2 and the second NMOSFET region NR2. The third active pattern AP3 and the fourth active pattern AP4 may be respectively formed on the second PMOSFET region PR2 and the second NMOSFET region NR2.

A device isolation layer ST may be formed on the substrate 100, filling the first and second trenches TR1 and TR2. The device isolation layer ST may include a dielectric material, such as a silicon oxide layer. The device isolation layer ST may be formed with a process such as a high-density plasma (HDP) process and/or a spin-on-glass (SOG) process. The device isolation layer ST may be recessed until upper portions of the first to fourth active patterns AP1 to AP4 are exposed. Therefore, the upper portion of each of the first to fourth active patterns AP1 to AP4 may protrude vertically upwards from the device isolation layer ST.

A dielectric layer EG may be formed, e.g. conformally formed, on the exposed upper portion of each of the first to fourth active patterns AP1 to AP4. The dielectric layer EG may be formed by oxidizing (e.g. thermally oxidizing) the exposed surface of each of the first to fourth active patterns AP1 to AP4. For example, the dielectric layer EG may include a silicon oxide layer.

Referring to FIGS. 7 and 8A to 8D, a mask layer PRM having an opening OPN may be formed on the substrate 100. The mask layer PRM may completely cover the second region RG2. The mask layer PRM may be patterned to form the openings OPN that partially exposes the first region RG1.

The opening OPN may extend in a first direction D1. The opening OPN may expose a central area of each of the first and second active patterns AP1 and AP2. The opening OPN may define positions and sizes of support patterns SUP which will be formed on the first and second active patterns AP1 and AP2.

An ion implantation process IIP such as a beamline ion implantation process, e.g. an implantation process having a high degree of anisotropy, may be performed on the mask layer PRM. Impurities may be implanted through the opening OPN into the first and second active patterns AP1 and AP2. Impurities may be implanted/injected into a portion of the sacrificial layer SAL that vertically overlaps the opening OPN, and thus the portion of the sacrificial layer SAL may be formed into a support pattern SUP. For example, the support pattern SUP may include helium (He) as impurities thereof, and may have an impurity concentration of about 5 at % to about 10 at %.

Impurities may also be implanted into a portion of the semiconductor layer SL that vertically overlaps the opening OPN, and thus an impurity region (see IMR of FIG. 3A) may be formed in the semiconductor layer SL.

As the support pattern SUP includes impurities, the support pattern SUP may have an etch selectivity with respect the sacrificial layer SAL. As the support pattern SUP includes impurities, the support pattern SUP may have an increased etching resistance. The ion implantation process IIP may provide the support pattern SUP with impurities to allow/enable/support the support pattern SUP to have an etch selectivity with respect to the sacrificial layer SAL, and the impurities are not limited to helium (He). Although not shown, the mask layer PRM may be removed, e.g. removed with an ashing process such as an oxygen ashing (02 ashing) process.

Referring to FIGS. 9 and 10A to 10D, on the first region RG1, a first sacrificial pattern PP1 may be formed to run across the first and second active patterns AP1 and AP2. On the second region RG2, second sacrificial patterns PP2 may be formed to run across the third and fourth active patterns AP3 and AP4. The first sacrificial pattern PP1 and the second sacrificial patterns PP2 may be formed to have their linear and/or bar shapes that extend in the first direction D1. The first sacrificial pattern PP1 may be formed to have a width greater than that of the second sacrificial pattern PP2. The first sacrificial pattern PP1 may be formed to vertically overlap the support patterns SUP.

For example, the formation of the first and second sacrificial patterns PP1 and PP2 may include forming a sacrificial layer on an entire surface of the substrate 100, forming hardmask patterns MP on the sacrificial layer, and using the hardmask patterns MP as an etching mask to pattern the sacrificial layer. The sacrificial layer may include polysilicon, e.g. undoped polysilicon.

According to some example embodiments of inventive concepts, the patterning process for forming the first and second sacrificial patterns PP1 and PP2 may include a lithography process that uses an extreme ultraviolet (EUV) radiation. In this description, the EUV may mean or refer to an ultraviolet ray having a wavelength of about 4 nm to about 124 nm, narrowly about 4 nm to about 20 nm, and more narrowly about 13.5 nm. The EUV may denote light whose energy is in the range of about 6.21 eV to about 124 eV, more narrowly of about 90 eV to about 95 eV.

The lithography process using the EUV may include exposure and development processes in which the EUV is irradiated onto a photoresist layer. For example, the photoresist layer may be an organic photoresist that contains an organic polymer, such as polyhydroxystyrene. The organic photoresist may further include a photosensitive compound that is sensitive to the EUV. The organic photoresist may additionally include a material whose EUV absorption coefficient is high, for example, an organometallic material, an iodine-containing material, or a fluorine-containing material. Alternatively or additionally, the photoresist layer may be or may include an inorganic photoresist that contains an inorganic material, such as tin oxide.

The photoresist layer may be formed to have a relatively small thickness. The photoresist layer exposed to the EUV may be developed to form photoresist patterns. When viewed in plan, the photoresist patterns may have a linear shape that extends in one direction, an island shape, a zigzag shape, a honeycomb shape, and/or a circular shape, but inventive concepts are not limited to a particular example.

The photoresist patterns may be used as an etching mask to pattern one or more mask layers that are stacked thereunder, and thus the hardmask patterns MP may be formed as discussed above. The hardmask patterns MP may be used as an etching mask to pattern a target layer or the sacrificial layer to form on a wafer a plurality of patterns or the first and second sacrificial patterns PP1 and PP2.

As a comparative example of inventive concepts, a multi-patterning technique (MPT) may be required to use two or more photomasks so as to form fine-pitched patterns on a wafer. In contrast, when an EUV lithography process is performed according to some example embodiments of inventive concepts, even a single photomask may form the first and second sacrificial patterns PP1 and PP2 having fine pitches. Accordingly, there may be a reduction in complexity in the fabrication of the semiconductor device, and/or a reduction in a cost of fabrication of the semiconductor device.

For example, a value equal to or less than about 45 nm may be given as a minimum pitch between the first and second sacrificial patterns PP1 and PP2 that are formed by the EUV lithography process according to the present embodiment. The EUV lithography process may be performed to form the first and second sacrificial patterns PP1 and PP2 that are sophisticated and fine, even without the multi-patterning process.

According to some example embodiments of inventive concepts, the EUV lithography process may used to perform not only the patterning process for forming the first and second sacrificial patterns PP1 and PP2, but also the patterning process for forming the first to fourth active patterns AP1 to AP, and no limitation is imposed on the EUV lithography process.

A pair of gate spacers GS may be formed on opposite sidewalls of each of the first and second sacrificial patterns PP1 and PP2. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN.

Referring to FIGS. 11 and 12A to 12F, first to fourth source/drain patterns SD1 to SD4 may be formed on the first to fourth active patterns AP1 to AP4, respectively. For example, the first source/drain patterns SD1 may be formed on the upper portion of the first active pattern AP1. A pair of first source/drain patterns SD1 may be formed on opposite sides of the first sacrificial pattern PP1. For example, the hardmask patterns MP and the gate spacers GS may be used as an etching mask to etch the upper portion of the first active pattern AP1, with the result that first recessions RS1 may be formed. During the etching of the upper portion of the first active pattern AP1, the device isolation layer ST may be recessed between the first active patterns AP1 (see FIG. 12C).

The first source/drain pattern SD1 may be formed by performing a selective epitaxial growth process in which an inner wall of the first recession RS1 of the first active pattern AP1 is used as a seed layer, e.g. as an initial layer for epitaxial growth. The formation of the first source/drain patterns SD1 may define a first channel pattern CH1 that includes first, second, and third semiconductor patterns SP1, SP2, and SP3 between the pair of first source/drain patterns SD1. For example, the selective epitaxial growth process may include a chemical vapor deposition (CVD) process such as a process using silane and/or disilane and/or germane, and/or a molecular beam epitaxy (MBE) process. The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers.

For example, impurities may be in-situ incorporated during the selective epitaxial growth process for forming the first source/drain patterns SD1. For example, phosphine and/or arsine and/or borane and/or diborane may be introduced during the epitaxial growth process. Alternatively or additionally, after the first source/drain patterns SD1 are formed, impurities may be implanted into the first source/drain patterns SD1. The first source/drain patterns SD1 may be doped to have a first conductivity type (e.g., p-type such as boron).

The second source/drain patterns SD2 may be formed on the upper portion of the second active pattern AP2. A pair of second source/drain patterns SD2 may be formed on opposite sides of the first sacrificial pattern PP1. The formation of the second source/drain patterns SD2 may define a second channel pattern CH2 that includes first, second, and third semiconductor patterns SP1, SP2, and SP3 between the pair of second source/drain patterns SD2.

For example, the hardmask patterns MP and the gate spacers GS may be used as an etching mask to etch the upper portion of the second active pattern AP2, with the result that second recessions RS2 may be formed. The second source/drain pattern SD2 may be formed by performing a selective epitaxial growth process in which an inner wall of the second recession RS2 of the second active pattern AP2 is used as a seed layer. For example, the second source/drain patterns SD2 may include the same semiconductor element (e.g., Si) as that of the substrate 100. The second source/drain patterns SD2 may be doped to have a second conductivity type (e.g., n-type such as phosphorus and/or arsenic).

Before the formation of the second source/drain patterns SD2, the sacrificial layers SAL may be partially removed which are exposed to the second recessions RS2. A dielectric material may fill areas where the sacrificial layers SAL are partially removed, thereby forming an inner spacer IP.

The formation of the third source/drain patterns SD3 on the upper portion of the third active pattern AP3 may be substantially the same as the formation of the first source/drain patterns SD1 discussed above. The first source/drain patterns SD1 and the third source/drain patterns SD3 may be formed at the same time. The formation of the third source/drain patterns SD3 may define a third channel pattern CH3 that includes first, second, and third semiconductor patterns SP1, SP2, and SP3 between a pair of third semiconductor patterns SD3.

The formation of the fourth source/drain patterns SD4 on the upper portion of the fourth active pattern AP4 may be substantially the same as the formation of the second source/drain patterns SD2 discussed above. The second source/drain patterns SD2 and the fourth source/drain patterns SD4 may be formed at the same time. The formation of the fourth source/drain patterns SD4 may define a fourth channel pattern CH4 that includes first, second, and third semiconductor patterns SP1, SP2, and SP3 between a pair of fourth source/drain patterns SD4. Before the formation of the fourth source/drain patterns SD4, an inner spacer IP may be formed. The first and third source/drain patterns SD1 and SD3 may be formed before, or after, or at the same time as, the second and fourth source/drain patterns SD2 and SD4.

Referring to FIGS. 13 and 14A to 14F, a first interlayer dielectric layer 110 may be formed to cover the first to fourth source/drain patterns SD1 to SD4, the hardmask patterns MP, and the gate spacers GS. For example, the first interlayer dielectric layer 110 may include a silicon oxide layer.

The first interlayer dielectric layer 110 may be planarized until top surfaces of the first and second sacrificial patterns PP1 and PP2 are exposed. An etch-back and/or chemical mechanical polishing (CMP) process may be employed to perform a planarization process on the first interlayer dielectric layer 110. The hardmask patterns MP may all be removed during the planarization process. As a result, the first interlayer dielectric layer 110 may have a top surface coplanar with those of the first and second sacrificial patterns PP1 and PP2 and those of the gate spacers GS.

The first and second sacrificial patterns PP1 and PP2 may be selectively removed. The removal of the first sacrificial pattern PP1 may form a first empty space ET1 that exposes the first and second active patterns AP1 and AP2 (see FIG. 14C). The removal of the second sacrificial patterns PP2 may form second empty spaces ET2 that expose the third and fourth active patterns AP3 and AP4 (see FIG. 14F).

On the first region RG1, the sacrificial layers SAL exposed to the first empty space ET1 may be selectively removed. For example, referring back to FIG. 14A, the sacrificial layers SAL may be selectively removed by performing an etching process in which the sacrificial layers SAL are selectively removed through the first empty space ET1. Any of the first, second, and third semiconductor patterns SP1, SP2, and SP3 may remain without being removed. As discussed above, because the support pattern SUP has an etch selectivity with respect to the sacrificial layer SAL, the support patterns SUP may also remain without being removed.

The removal of the sacrificial layers SAL may form third empty spaces ET3. Each of the third empty spaces ET3 may be defined between neighboring ones of the first, second, and third semiconductor patterns SP1, SP2, and SP3.

The formation of the third empty spaces ET3 may cause structural instability of the first, second, and third semiconductor patterns SP1, SP2, and SP3 on the first region RG1. When the support patterns SUP are omitted, as discussed with reference to FIG. 4, at least one selected from the first, second, and third semiconductor patterns SP1, SP2, and SP3 may become bent.

In contrast, according to some example embodiments of inventive concepts, the support patterns SUP may connect the substrate 100 to the first, second, and third semiconductor patterns SP1, SP2, and SP3, which may achieve structural stability. Accordingly, it may be possible to prevent or reduce the likelihood of or impact of bending issues of the first, second, and third semiconductor patterns SP1, SP2, and SP3 on the first region RG1.

On the second region RG2, the sacrificial layers SAL exposed to the second empty space ET2 may be selectively removed. For example, referring back to FIG. 14F, the sacrificial layers SAL may be selectively removed by performing an etching process in which the sacrificial layers SAL are selectively removed through the second empty space ET2. Any of the first, second, and third semiconductor patterns SP1, SP2, and SP3 may remain without being removed. The removal of the sacrificial layers SAL may form fourth empty spaces ET4. Each of the fourth empty spaces ET4 may be defined between neighboring ones of the first, second, and third semiconductor patterns SP1, SP2, and SP3.

Referring to FIGS. 15 and 16A to 16F, first and second gate dielectric layers GI1 and GI2 may be formed respectively in the first and second empty spaces ET1 and ET2. The first gate dielectric layer GI1 may be formed in the third empty space ET3, and may surround the first, second, and third semiconductor patterns SP1, SP2, and SP3. The second gate dielectric layer GI2 may be formed in the fourth empty space ET4, and may surround the first, second, and third semiconductor patterns SP1, SP2, and SP3.

First and second gate electrodes GE1 and GE2 may be formed respectively in the first and second empty spaces ET1 and ET2. The first gate electrode GE1 may include first, second, and third parts P01, P02, and P03 that fill the third empty space ET3, and may also include a fourth part P04 that fills the first empty space ET1. The second gate electrode GE2 may include first, second, and third parts P01, P02, and P03 that fill the fourth empty space ET4, and may also include a fourth part P04 that fills the second empty space ET2. A gate capping pattern GP may be formed on each of the first and second gate electrodes GE1 and GE2.

Referring back to FIGS. 1 and 2A to 2H, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and to have electrical connection with the first, second, third, and fourth source/drain patterns SD1, SD2, SD3, and SD4. Gate contacts GC may be formed to penetrate the second interlayer dielectric layers 120 and the gate capping pattern GP and to have electrical connection with the first and second gate electrodes GE1 and GE2.

A third interlayer dielectric layer 130 may be formed on the second interlayer dielectric layer 120. A first metal layer M1 may be formed in the third interlayer dielectric layer 130. The formation of the first metal layer M1 may include forming first lines ILL A fourth interlayer dielectric layer 140 may be formed on the first metal layer M1. A second metal layer M2 may be formed in the fourth interlayer dielectric layer 140. The formation of the second metal layer M2 may include forming second lines IL2.

According to some example embodiments of inventive concepts, an EUV lithography process may be employed to form the first lines IL1 and/or the second lines IL2 in the first metal layer M1 and/or the second metal layer M2. A detailed description of the EUV lithography process used in BEOL processes may be substantially the same as that for forming the first and second sacrificial patterns PP1 and PP2. For example, a distance equal to or less than about 45 nm may be given as a minimum pitch between the first lines IL1 formed by the EUV lithography process of the present embodiment.

Figure 17:
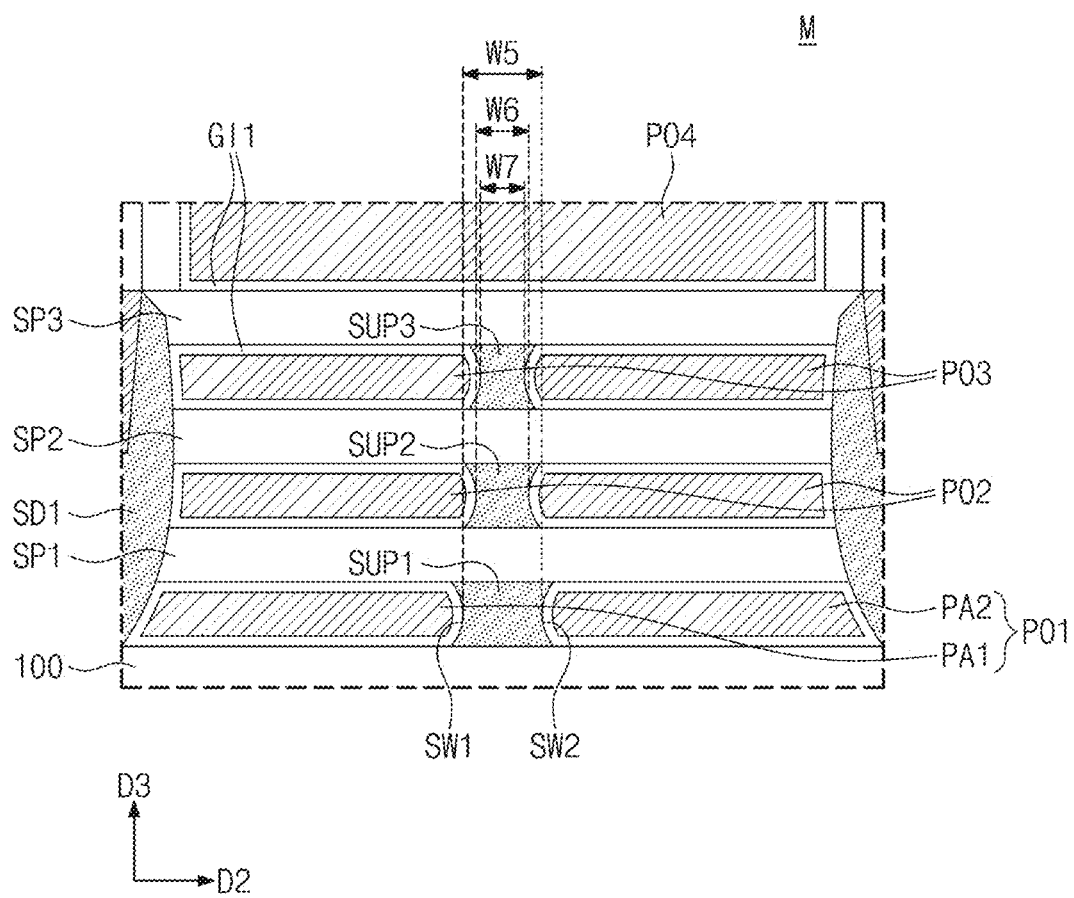
FIG. 17 illustrates an enlarged cross-sectional view of section M depicted in FIG. 2A, showing a semiconductor device according to some example embodiments of inventive concepts.

FIG. 17 illustrates an enlarged cross-sectional view of section M depicted in FIG. 2A, showing a semiconductor device according to some example embodiments of inventive concepts. In example embodiments that follow, a detailed description of technical features repetitive to those discussed with reference to FIGS. 1 to 4 will be omitted, and a difference thereof will be discussed in detail.

Referring to FIG. 17, the support pattern SUP may include a first support pattern SUP1 interposed between the substrate 100 and the first semiconductor pattern SP1, a second support pattern SUP2 interposed between the first semiconductor pattern SP1 and the second semiconductor pattern SP2, and a third support pattern SUP3 interposed between the second semiconductor pattern SP2 and the third semiconductor pattern SP3.

The first support pattern SUP1 may have a first sidewall SW1 and a second sidewall SW2 each of which is crooked. For example, each of the first and second sidewalls SW1 and SW2 may be recessed toward a center of the first support pattern SUP1. The first support pattern SUP1 may have a width that decreases to a minimum value and then increases again, in a direction from the substrate 100 toward the first semiconductor pattern SP1. The first support pattern SUP1 may have a fifth width W5 as the minimum width thereof.

The second support pattern SUP2 may have a width that decreases to a minimum value and then increases again, in a direction from the first semiconductor pattern SP1 toward the second semiconductor pattern SP2. The second support pattern SUP2 may have a sixth width W6 as the minimum width thereof.

The third support pattern SUP3 may have a width that decreases to a minimum value and then increases again, in a direction from the second semiconductor pattern SP2 toward the third semiconductor pattern SP3. The third support pattern SUP3 may have a seventh width W7 as the minimum width thereof. The fifth, sixth, and seventh widths W5, W6, and W7 may be different from each other. For example, the sixth width W6 may be greater than the fifth width W5, and the seventh width W7 may be greater than the sixth width W6.

A semiconductor device according to inventive concepts may be configured such that a support pattern may be applied to a long channel transistor, and that the support pattern may prevent or reduce the likelihood of a channel from being bent. Therefore, it may be possible to uniform driving profiles between long channel transistors and to suppress deterioration in electrical characteristics.

Although some example embodiments of inventive concepts have been discussed with reference to accompanying figures, it will be understood that various changes in form and details may be made therein without departing from the spirit and scope of inventive concepts. It therefore will be understood that example embodiments described above are just illustrative but not limitative in all aspects.

What is claimed is:
1. A semiconductor device, comprising:
a substrate including a first region and a second region;
a first active pattern on the first region, the first active pattern including a pair of first source/drain patterns and a first channel pattern between ones of the pair of first source/drain patterns, the first source/drain patterns being spaced apart in a first direction, the first channel pattern including a plurality of first semiconductor patterns stacked on the substrate;
a second active pattern on the second region, the second active pattern including a pair of second source/drain patterns and a second channel pattern between ones the pair of second source/drain patterns, the second channel pattern including a plurality of second semiconductor patterns stacked on the substrate;
a support pattern between two vertically adjacent ones of the plurality of first semiconductor patterns, the support pattern connecting the two vertically adjacent first semiconductor patterns to each other; and
a first gate electrode and a second gate electrode on the first channel pattern and the second channel pattern, respectively,
wherein a length of the first channel pattern is greater than a length of the second channel pattern,
a ratio of a width of the support pattern to the length of the first channel pattern is in a range of about 0.05 to about 0.2, and
wherein the first gate electrode includes a first segment and a second segment that are between the two vertically adjacent first semiconductor patterns, and the support pattern is between the first segment and the second segment in the first direction.

2. The semiconductor device of claim 1, wherein the support pattern includes silicon-germanium (SiGe) and an impurity,
  a germanium concentration of the support pattern is in a range of about 10 at % to about 35 at %, and
  an impurity concentration of the support pattern is in a range of about 5 at% to about 10 at%.

3. The semiconductor device of claim 1, wherein
  the length of the first channel pattern is in a range of about 70 nm to about 300 nm, and
  the width of the support pattern is in a range of about 3.5 nm to about 60 nm.

4. The semiconductor device of claim 1, wherein at least one of the plurality of first semiconductor patterns includes an impurity region vertically overlapping the support pattern, an impurity concentration of the impurity region increases to a first value and then decreases in a direction from one side toward another side of the impurity region.

5. The semiconductor device of claim 1, further comprising:
  a first gate dielectric layer between the first channel pattern and the first gate electrode; and
  a second gate dielectric layer between the second channel pattern and the second gate electrode,
  wherein the support pattern has a first sidewall and a second sidewall that are opposite to each other, and
  the first gate dielectric layer covers the first sidewall and the second sidewall.

6. The semiconductor device of claim 5, wherein at least one selected from the first and second sidewalls is recessed toward a center of the support pattern.

7. The semiconductor device of claim 5, wherein the width of the support pattern decreases to a second value and then increases in a direction from one of the two vertically adjacent first semiconductor patterns toward the other of the two vertically adjacent first semiconductor patterns.

8. The semiconductor device of claim 1, wherein the support pattern is provided in plural, and the plurality of support patterns connect the substrate to the plurality of first semiconductor patterns.

9. The semiconductor device of claim 1, wherein
  the support pattern is not on the second region, and
  the second gate electrode is on a top surface of, opposite sidewalls of, and a bottom surface of each of the plurality of second semiconductor patterns.

10. A semiconductor device, comprising:
  a substrate including a first region and a second region;
  a first active pattern on the first region, the first active pattern including a pair of first source/drain patterns and a first channel pattern between one of the pair of first source/drain patterns and the other of the pair of first source/drain patterns, the first channel pattern including a plurality of first semiconductor patterns stacked on the substrate;
  a second active pattern on the second region, the second active pattern including a pair of second source/drain patterns and a second channel pattern between one of the pair of second source/drain patterns and the other of the pair of second source/drain patterns, the second channel pattern including a plurality of second semiconductor patterns stacked on the substrate;
  a support pattern between two vertically adjacent ones of the plurality of first semiconductor patterns, the support pattern connecting the two vertically adjacent first semiconductor patterns to each other; and
  a first gate electrode and a second gate electrode on the first channel pattern and the second channel pattern, respectively,
  wherein a length of the first channel pattern is greater than a length of the second channel pattern, and
  the support pattern contains an impurity of about 5 at % to about 10 at %.

11. The semiconductor device of claim 10, wherein a ratio of a width of the support pattern to the length of the first channel pattern is in a range of about 0.05 to about 0.2.

12. The semiconductor device of claim 10, further comprising:
  a first gate dielectric layer between the first channel pattern and the first gate electrode; and
  a second gate dielectric layer between the second channel pattern and the second gate electrode,
  wherein the support pattern includes a first sidewall and a second sidewall that are opposite to each other, and
  the first gate dielectric layer covers the first sidewall and the second sidewall.

13. The semiconductor device of claim 12, wherein at least one selected from the first and second sidewalls is recessed toward a center of the support pattern.

14. The semiconductor device of claim 10, wherein the first gate electrode includes a first segment and a second segment that are between the two vertically adjacent first semiconductor patterns, and
  the support pattern is between the first segment and the second segment.

15. A semiconductor device, comprising:
  a substrate including a first region and a second region;
  a device isolation layer that defines a first active area on the first region and a second active area on the second region;
  a pair of first source/drain patterns and a pair of second source/drain patterns on the first active area and the second active area, respectively, the first source/drain patterns being spaced apart in a first direction;
  a first channel pattern and a second channel pattern, the first channel pattern being between members of the pair of first source/drain patterns, the second channel pattern being between members of the pair of second source/drain patterns, and each of the first and second channel patterns including first, second, and third semiconductor patterns that are sequentially stacked on the substrate;
  first, second, and third support patterns on the first active area, the first support pattern between the substrate and the first semiconductor pattern, the second support pattern between the first semiconductor pattern and the second semiconductor pattern, and the third support pattern between the second semiconductor pattern and the third semiconductor pattern;
  a first gate electrode and a second gate electrode on the first channel pattern and the second channel pattern, respectively;
  a first gate dielectric layer and a second gate dielectric layer, the first gate dielectric layer between the first channel pattern and the first gate electrode, and the second gate dielectric layer between the second channel pattern and the second gate electrode;
  a pair of gate spacers on opposite sides of each of the first and second gate electrodes;
  a gate capping pattern on a top surface of each of the first and second gate electrodes;
  a plurality of active contacts electrically connected to the first and second source/drain patterns;

a plurality of gate contacts electrically connected to the first and second gate electrodes;
a first metal layer on the active contacts and the gate contacts, the first metal layer including a plurality of first lines electrically connected to the active contacts and the gate contacts; and
a second metal layer on the first metal layer,
wherein a length of the first channel pattern is greater than a length of the second channel pattern,
at least one selected from the first, second, and third support patterns has a crooked sidewall, and
wherein the first gate electrode includes a first sgment and a second segment that are between the two vetically adjacent first semiconductor patterns, and the first support pattern is between the first segment and the second segment in the first direction.

16. The semiconductor device of claim 15, wherein the crooked sidewall is recessed toward a center of the at least one selected from the first, second, and third support patterns.

17. The semiconductor device of claim 15, wherein
a width of the second support pattern is greater than a width of the third support pattern, and
a width of the first support pattern is greater than the width of the second support pattern.

18. The semiconductor device of claim 15, wherein a ratio of a width of the third support pattern to the length of the first channel pattern is in a range of about 0.05 to about 0.2.

19. The semiconductor device of claim 15, wherein the first gate dielectric layer covers the crooked sidewall.

* * * * *